US012696494B2

(12) United States Patent
Lu et al.

(10) Patent No.: US 12,696,494 B2
(45) Date of Patent: Jul. 28, 2026

(54) METHOD FOR FORMING TRANSISTOR STRUCTURE WITH A VERTICALLY GROWN SOURCE AND DRAIN

(71) Applicant: Invention And Collaboration Laboratory Pte. Ltd., Singapore (SG)

(72) Inventors: Chao-Chun Lu, Hsinchu (TW); Li-Ping Huang, Hsinchu (TW); Ming-Hong Kuo, Hsinchu (TW)

(73) Assignee: INVENTION AND COLLABORATION LABORATORY PTE. LTD., Singapore (SG)

( * ) Notice: Subject to any disclaimer, the term of this patent is extended or adjusted under 35 U.S.C. 154(b) by 590 days.

(21) Appl. No.: 17/813,656

(22) Filed: Jul. 20, 2022

(65) Prior Publication Data

US 2023/0027913 A1 Jan. 26, 2023

Related U.S. Application Data

(60) Provisional application No. 63/224,921, filed on Jul. 23, 2021.

(51) Int. Cl.
*H10B 12/00* (2023.01)
*H10D 30/67* (2025.01)
(Continued)

(52) U.S. Cl.
CPC ......... *H10D 62/102* (2025.01); *H10B 12/053* (2023.02); *H10B 12/488* (2023.02);
(Continued)

(58) Field of Classification Search
CPC ............. H10D 62/102; H10D 30/6715; H10D 30/6757; H10D 64/01; H10D 64/512;
(Continued)

(56) References Cited

U.S. PATENT DOCUMENTS 6,093,947 A 7/2000 Hanafi
7,319,255 B2 1/2008 Hwang
(Continued)

FOREIGN PATENT DOCUMENTS

CN 1874003 A 12/2006
CN 101140950 A 3/2008
(Continued)

OTHER PUBLICATIONS

KR Office Action dated Dec. 13, 2023 in Korean Application No. 10-2022-0091245.
(Continued)

*Primary Examiner* — Nelson Garces
(74) *Attorney, Agent, or Firm* — McClure, Qualey & Rodack, LLP

(57) ABSTRACT

A method for forming a transistor structure includes steps as follows: A substrate with an original surface is prepared. Next a gate conductive region is formed, wherein at least a portion of the gate conductive region is disposed below the original surface, and a bottom wall and sidewalls of the gate conductive region is surrounded by a gate dielectric layer. Then, a first conductive region is formed, wherein a bottom wall of the first conductive region is aligned or substantially aligned with a top wall of the gate conductive region.

9 Claims, 34 Drawing Sheets

(51) Int. Cl.

| | |
|---|---|
| *H10D 62/10* | (2025.01) |
| *H10D 64/01* | (2025.01) |
| *H10D 64/27* | (2025.01) |
| *H10D 30/63* | (2025.01) |

(52) U.S. Cl.
CPC ..... *H10D 30/6715* (2025.01); *H10D 30/6757* (2025.01); *H10D 64/01* (2025.01); *H10D 64/512* (2025.01); *H10D 30/637* (2025.01); *H10D 64/513* (2025.01)

(58) Field of Classification Search
CPC .. H10D 30/637; H10D 64/513; H10D 30/608; H10D 30/751; H10D 62/021; H10D 62/314; H10D 64/027; H10B 12/053; H10B 12/488; H10B 12/34; H10B 12/485; H01L 21/76224; H01L 27/10876; H01L 27/10891
See application file for complete search history.

(56) References Cited

U.S. PATENT DOCUMENTS

| | | | | |
|---|---|---|---|---|
| 7,612,406 | B2 | 11/2009 | Kluge | |
| 8,053,307 | B2 | 11/2011 | Seo et al. | |
| 8,597,998 | B2 | 12/2013 | Bhalla et al. | |
| 10,043,854 | B1* | 8/2018 | Shin | H10D 62/115 |
| 2001/0009800 | A1 | 7/2001 | Hijzen | |
| 2006/0273388 | A1 | 12/2006 | Yamazaki | |
| 2007/0007571 | A1 | 1/2007 | Lindsay | |
| 2008/0061320 | A1 | 3/2008 | von Kluge | |
| 2008/0253160 | A1* | 10/2008 | Popp | H10B 12/34 |
| | | | | 365/72 |
| 2013/0313637 | A1* | 11/2013 | Yoshida | H01L 29/1037 |
| | | | | 257/334 |
| 2015/0340368 | A1* | 11/2015 | Oshima | H10B 12/033 |
| | | | | 438/430 |
| 2018/0097081 | A1* | 4/2018 | Cao | H10D 64/693 |
| 2020/0006488 | A1 | 1/2020 | Mehandru | |
| 2021/0375744 | A1* | 12/2021 | Huang | H01L 21/7682 |

FOREIGN PATENT DOCUMENTS

| | | | |
|---|---|---|---|
| CN | 102683407 | A | 9/2012 |
| CN | 108511518 | A | 9/2018 |
| CN | 110875391 | A | 3/2020 |
| DE | 4408764 | A1 | 9/1994 |
| JP | 2003282869 | A | 10/2003 |
| JP | 2008530800 | A | 8/2008 |
| KR | 100714900 | B1 | 5/2007 |
| KR | 20180130189 | A | 12/2018 |
| TW | 200818468 | A | 4/2008 |
| WO | 2014103734 | A1 | 7/2014 |
| WO | 2014125950 | A1 | 8/2014 |

OTHER PUBLICATIONS

Non-Final Office Action issued in U.S. Appl. No. 17/828,304, filed May 31, 2022, mailed Jan. 19, 2024.
TW Office Action dated Feb. 14, 2023 in Taiwan application No. 111120281.
CN Office Action dated Dec. 5, 2023 in Chinese application No. 2022-117535.
CN Office Action dated Dec. 5, 2023 in Chinese application No. 2022-117537.
Non-Final Office Action issued in U.S. Appl. No. 17/751,727, filed May 24, 2022, mailed Mar. 12, 2025.
CN Office Action dated May 1, 2025 in Chinese application No. 202210624636.8.
Notice of Allowance dated Jul. 10, 2025 issued in U.S. Appl. No. 17/751,727, filed May 24, 2022.
CN Office Action dated Oct. 18, 2025 in Chinese application No. 202210624636.8.
CN Office Action dated Dec. 31, 2025 in Chinese application No. 202210866156.2.

* cited by examiner

Active Area
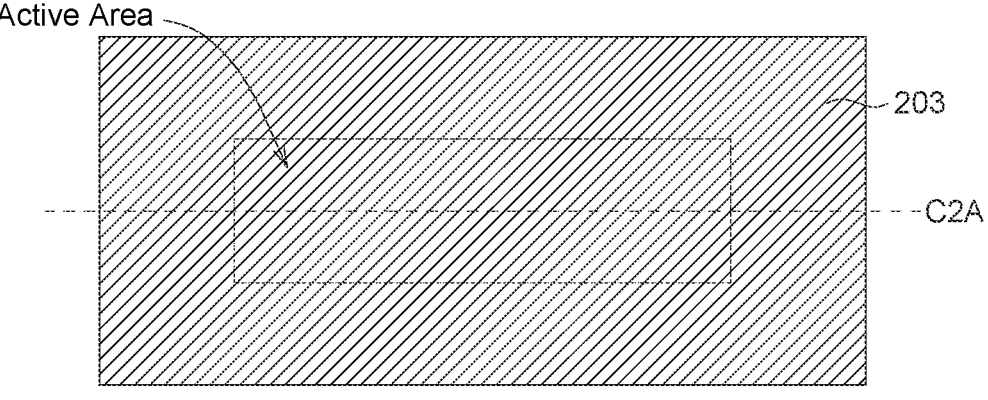
FIG. 2A(1)
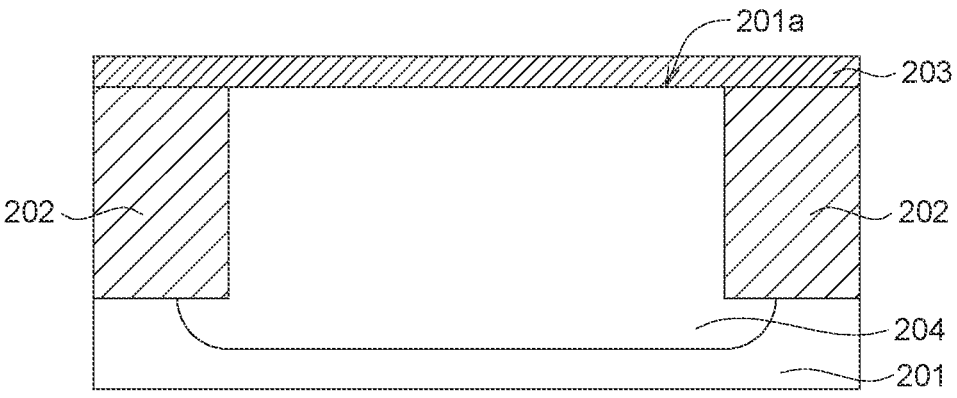
FIG. 2A(2)

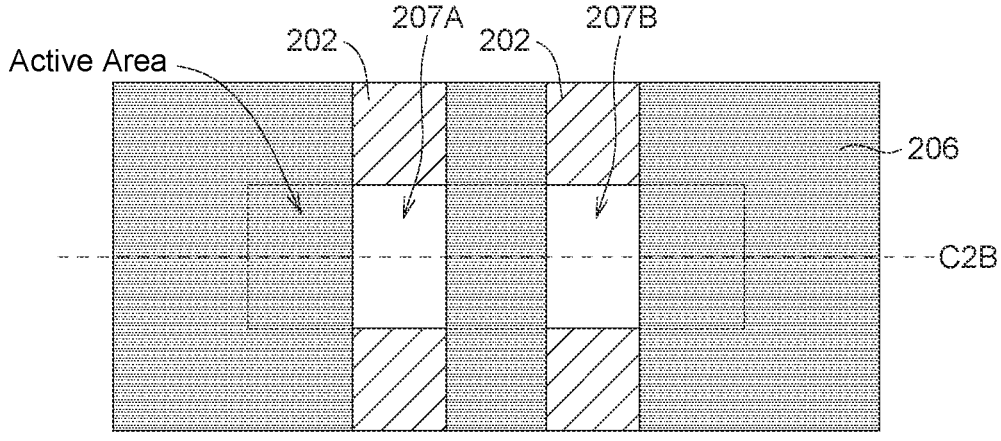
FIG. 2B(1)
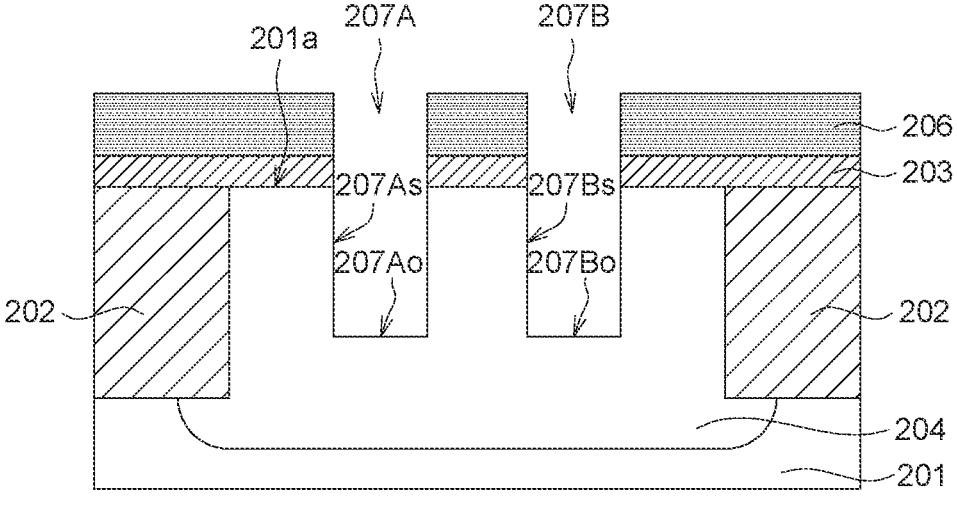
FIG. 2B(2)

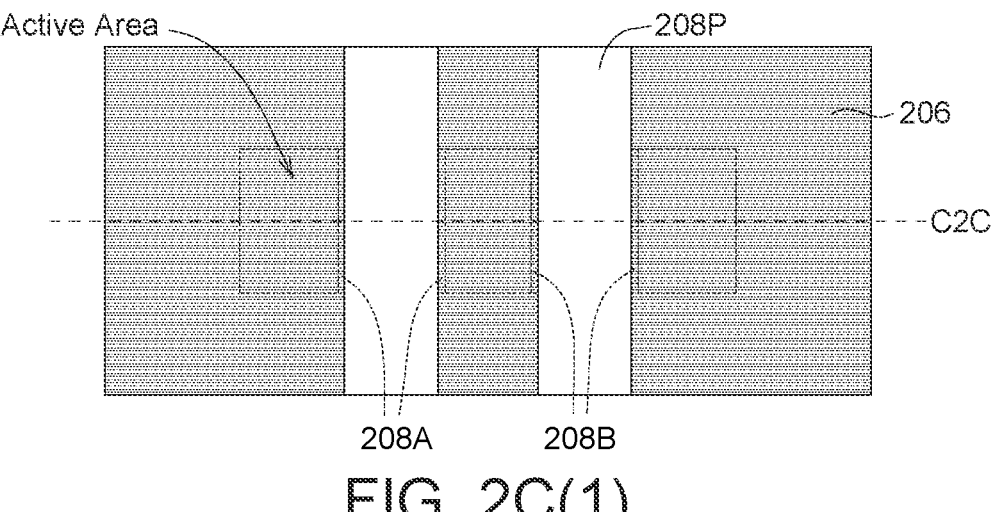
FIG. 2C(1)
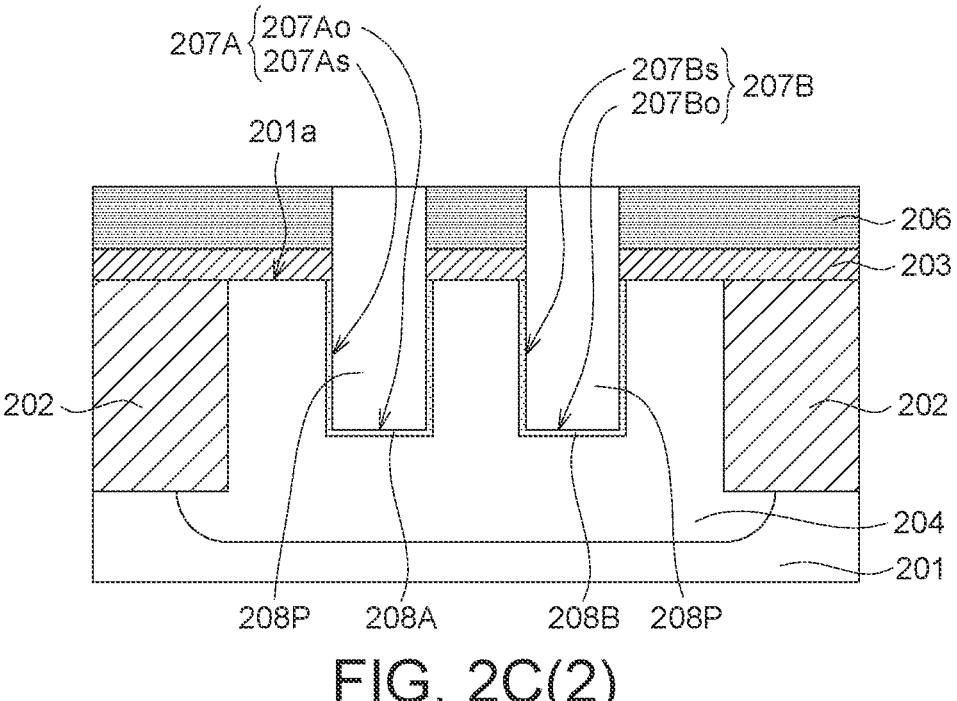
FIG. 2C(2)

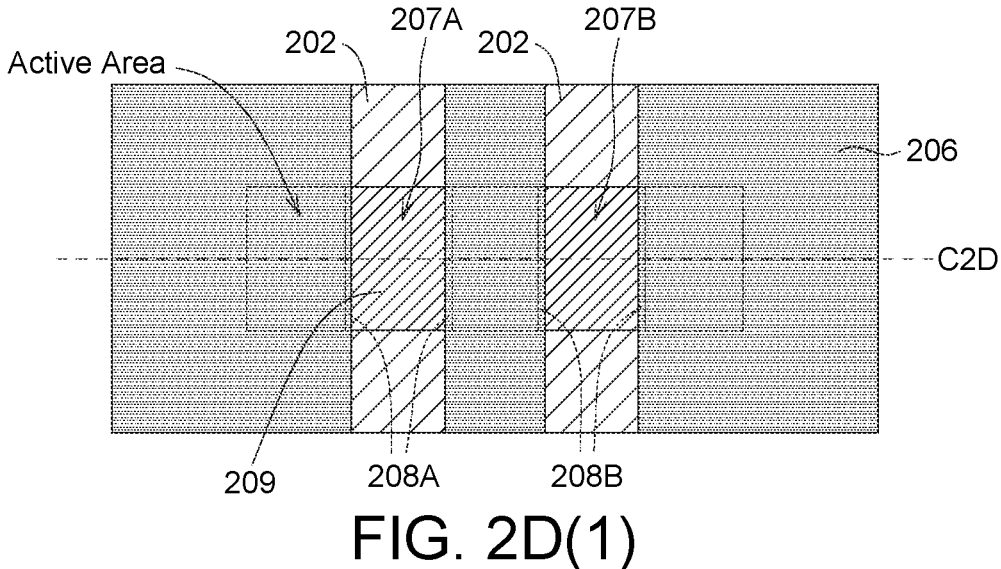
FIG. 2D(1)
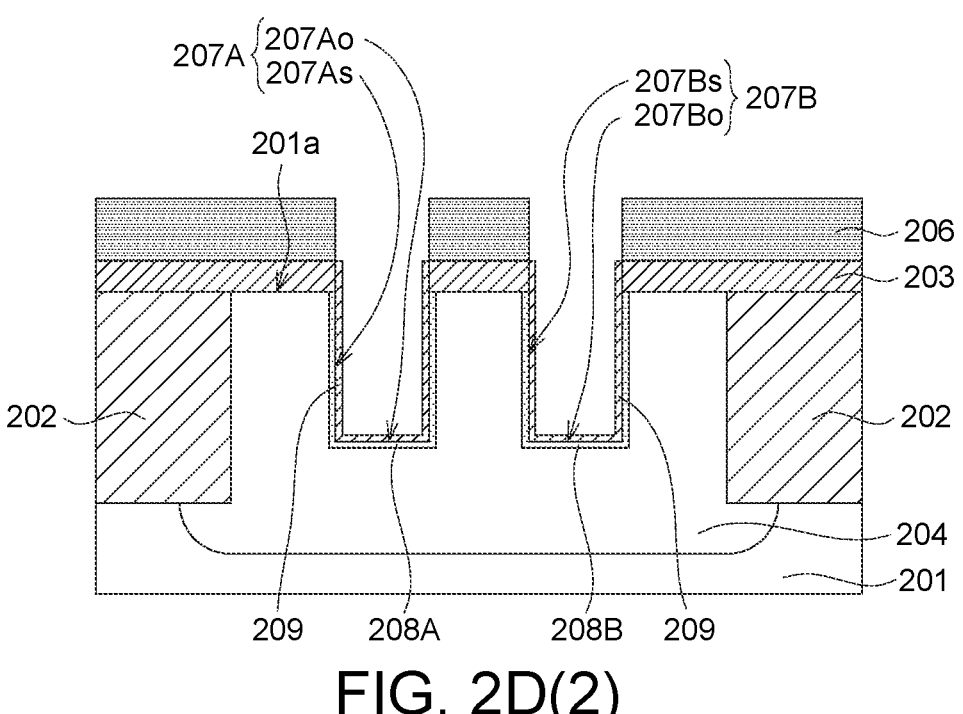
FIG. 2D(2)

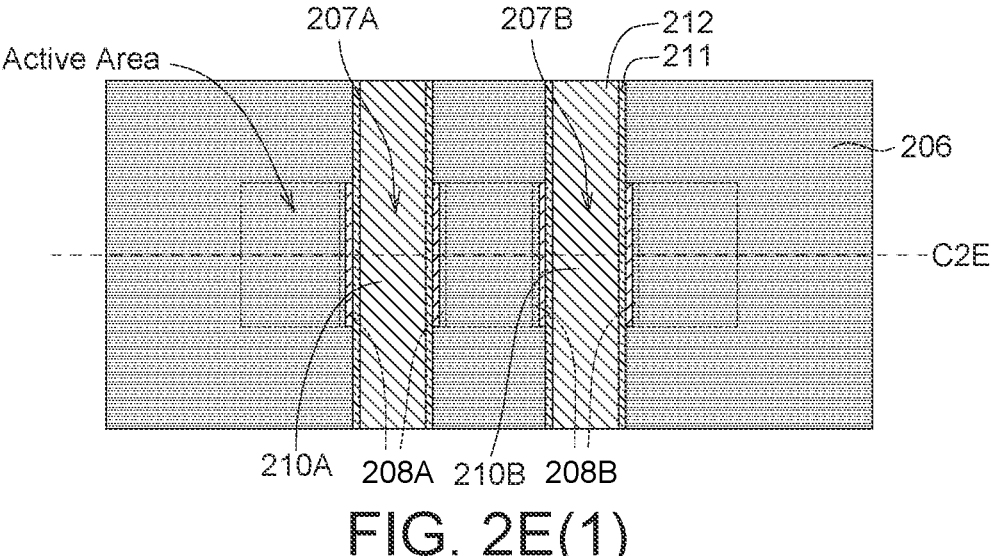
FIG. 2E(1)
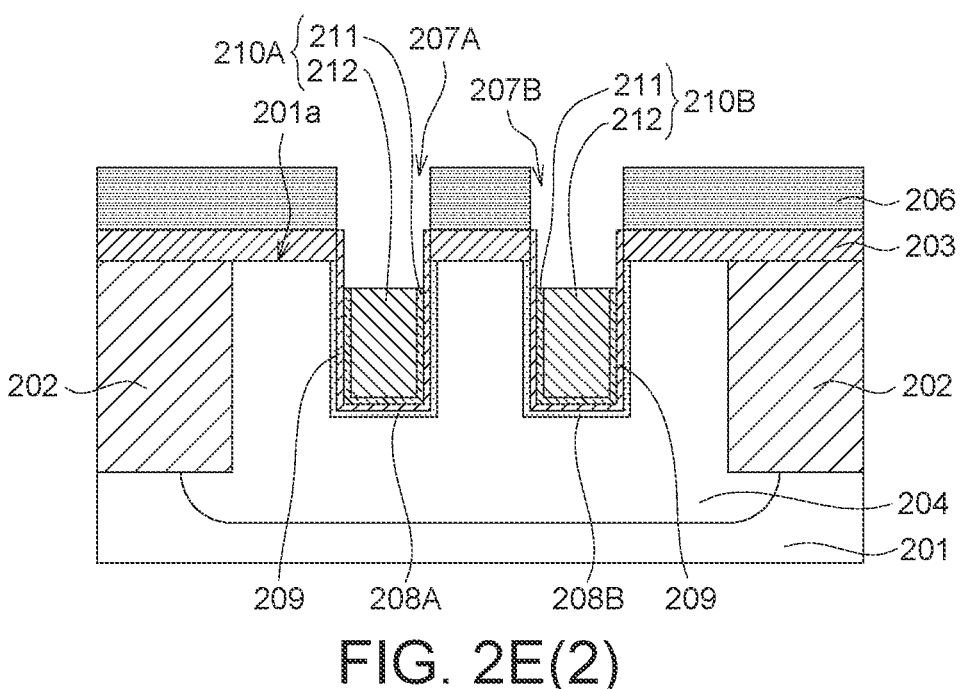
FIG. 2E(2)

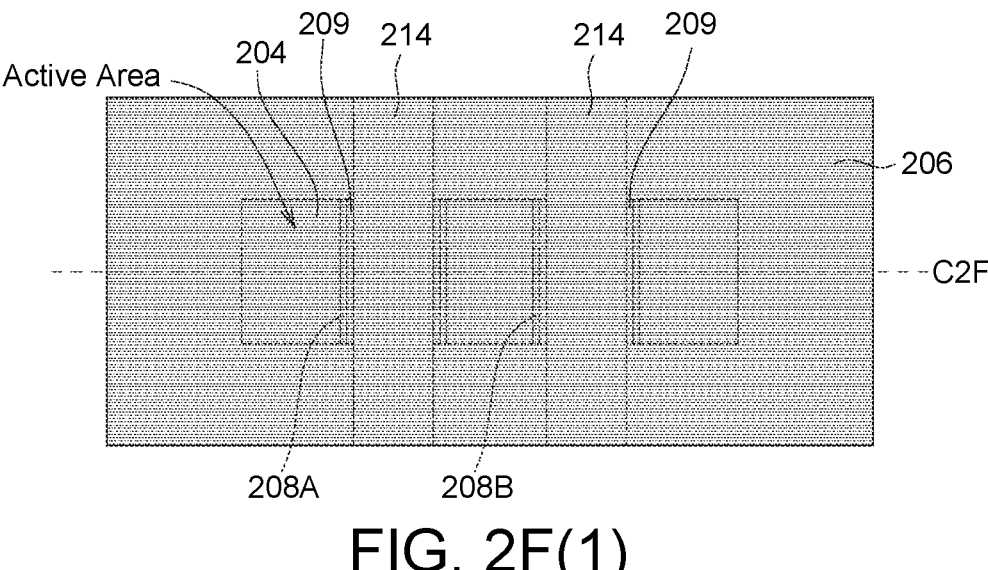
FIG. 2F(1)
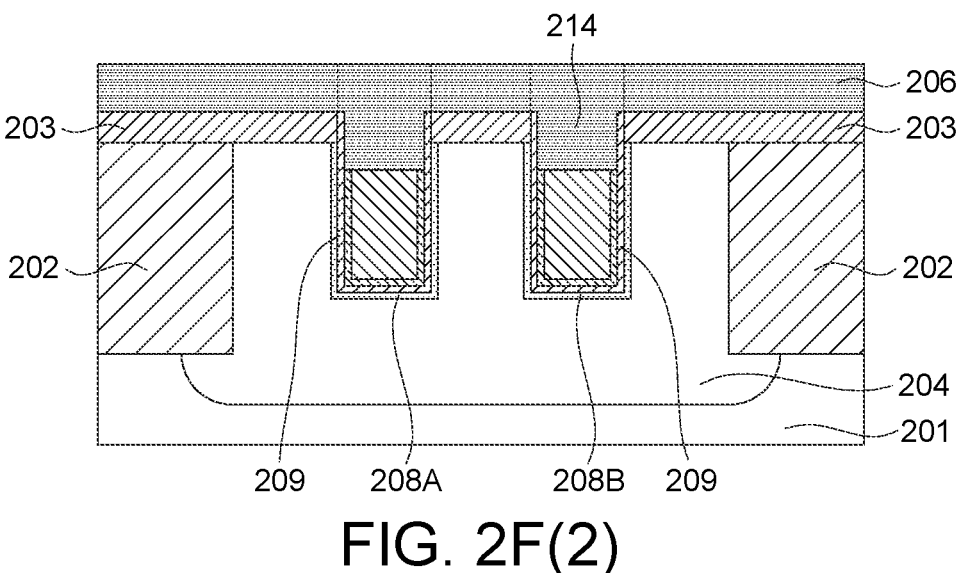
FIG. 2F(2)

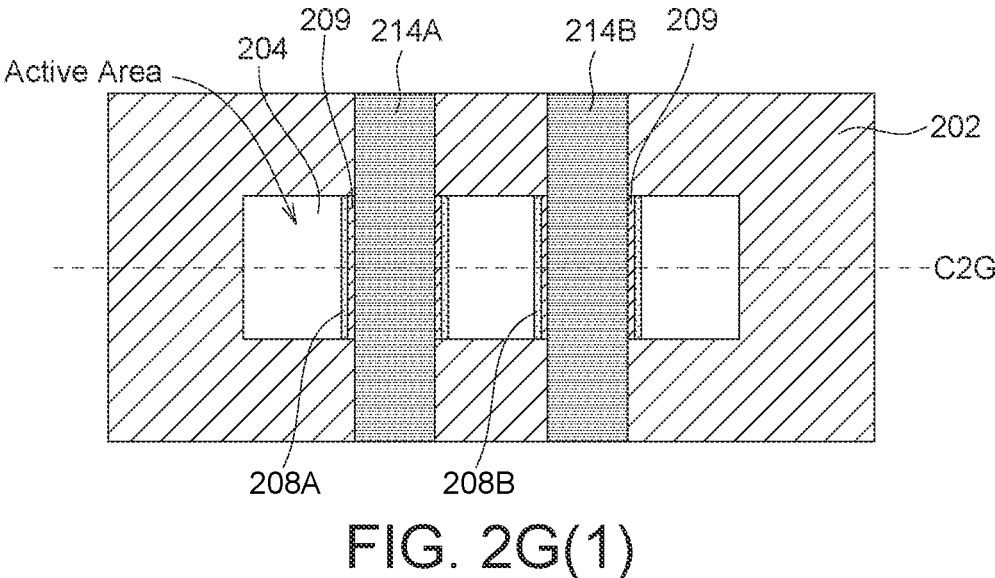
FIG. 2G(1)
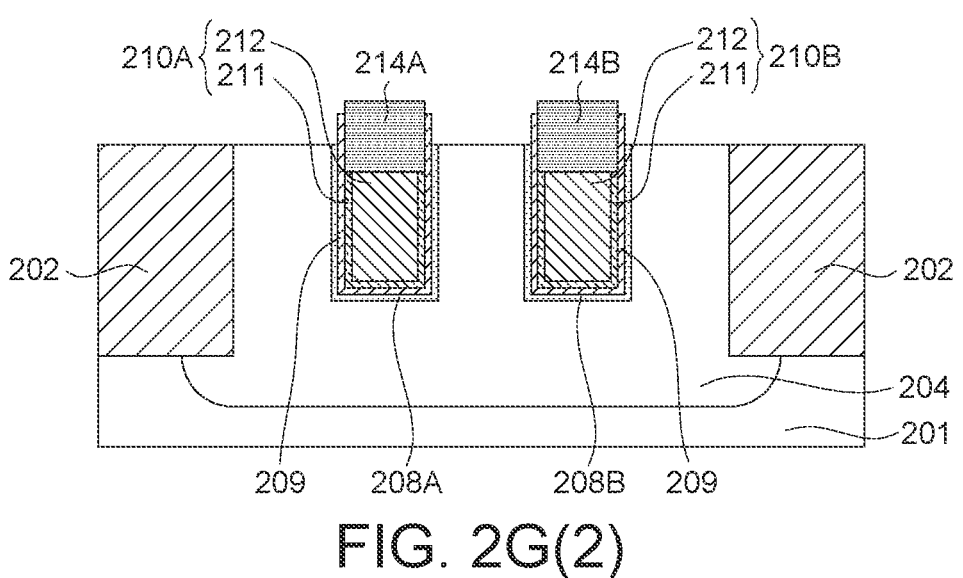
FIG. 2G(2)

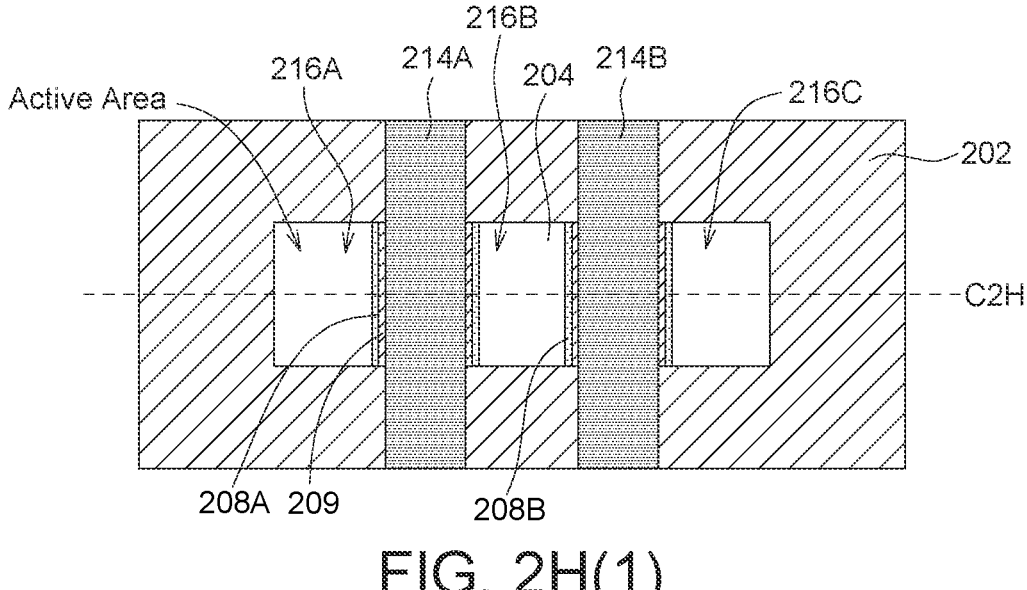
FIG. 2H(1)

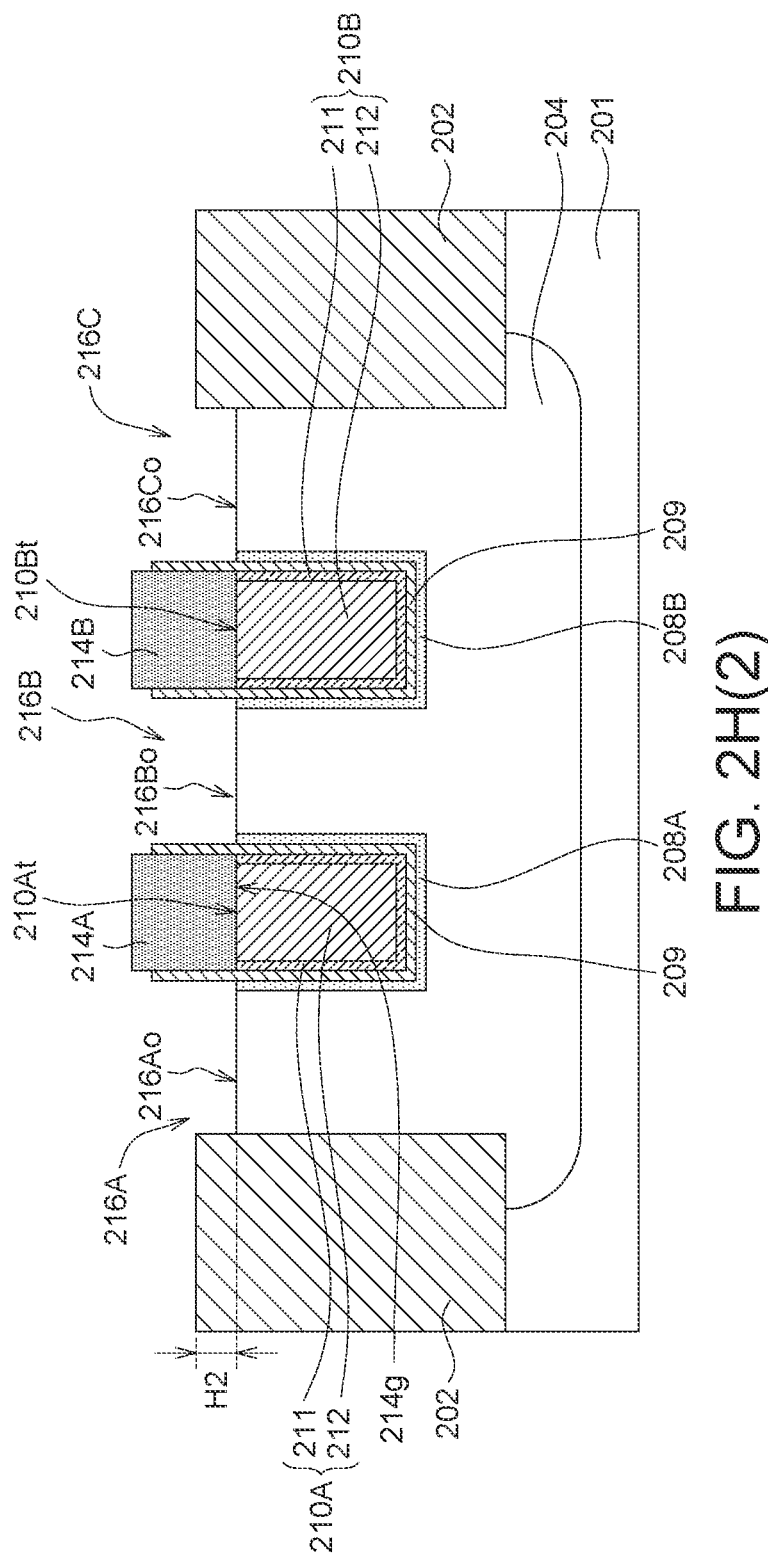
FIG. 2H(2)

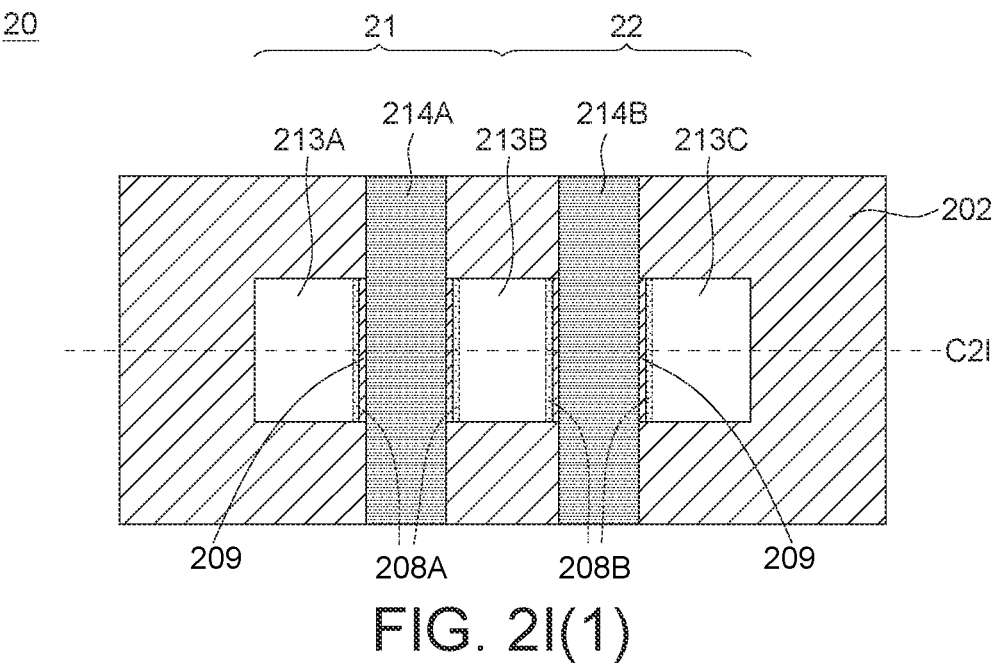
FIG. 2I(1)
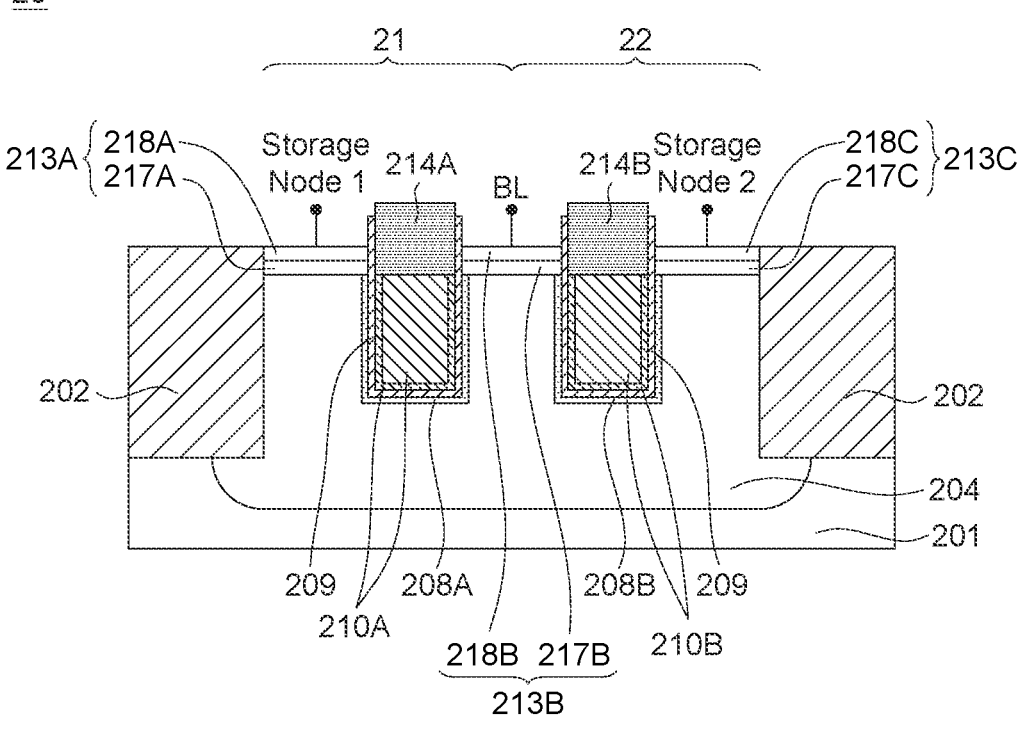
FIG. 2I(2)

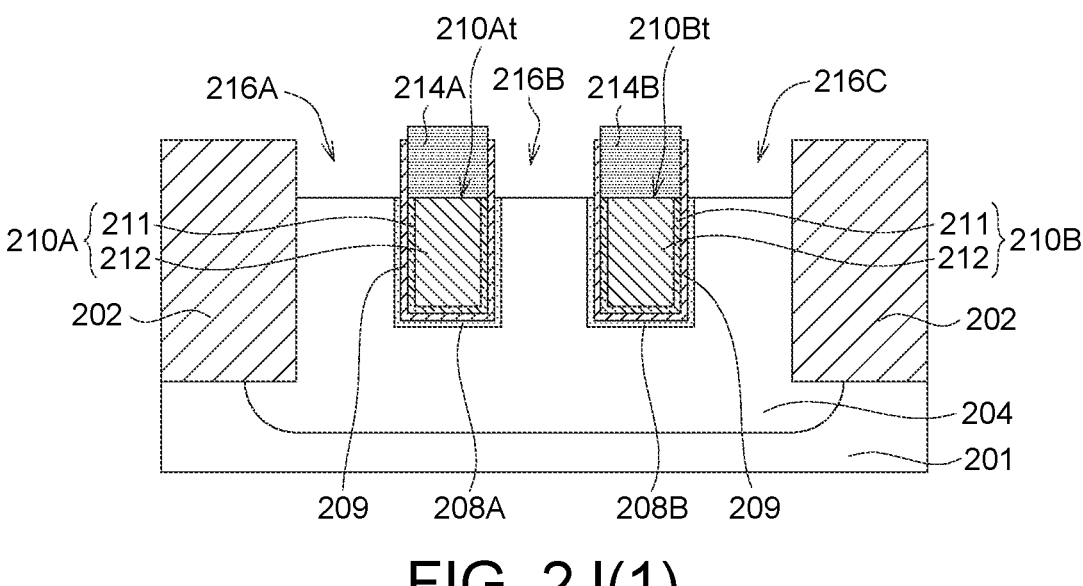
FIG. 2J(1)
FIG. 2J(2)

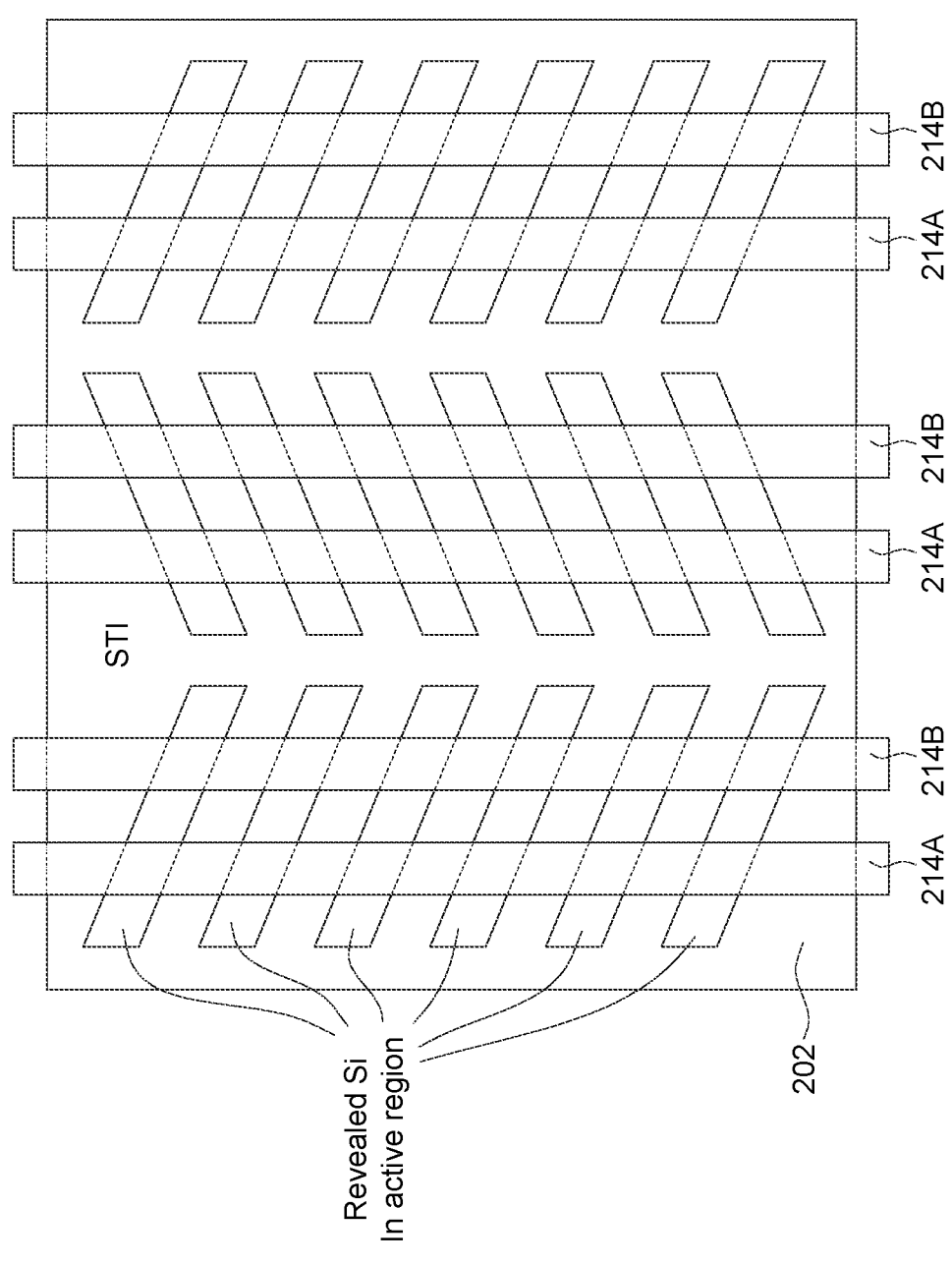
FIG. 2K(1)

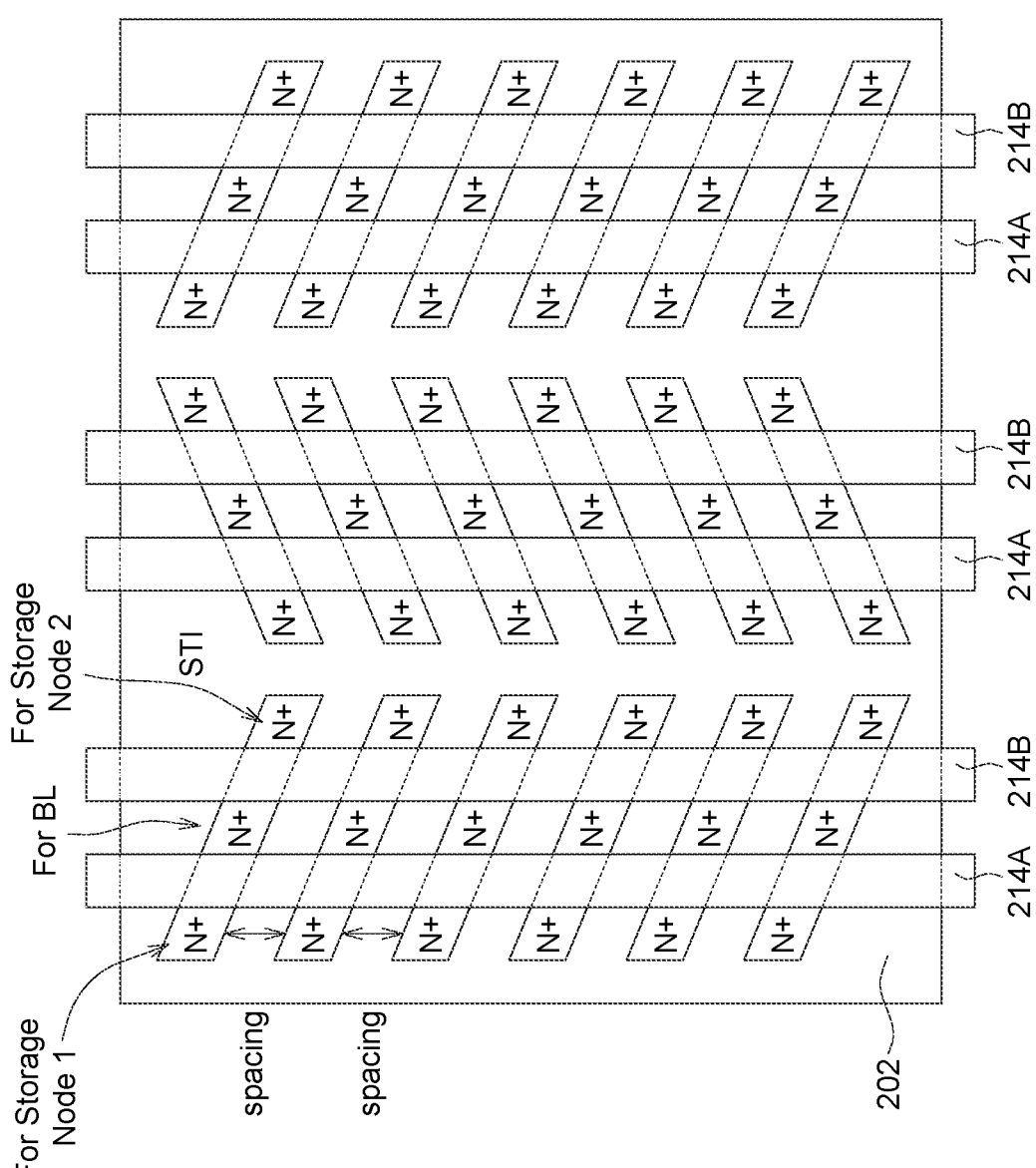
FIG. 2K(2)

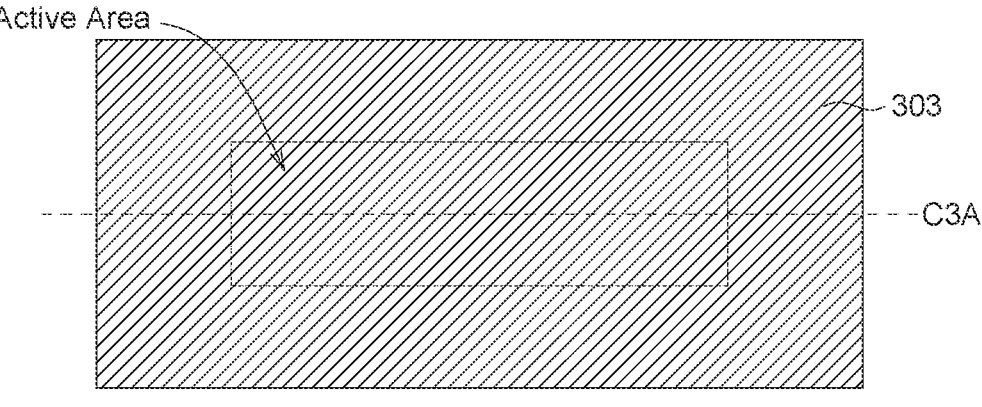
FIG. 3A(1)
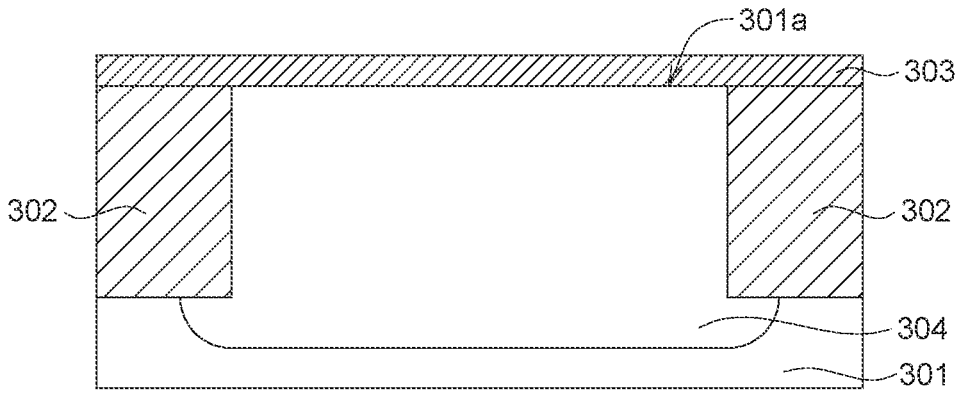
FIG. 3A(2)

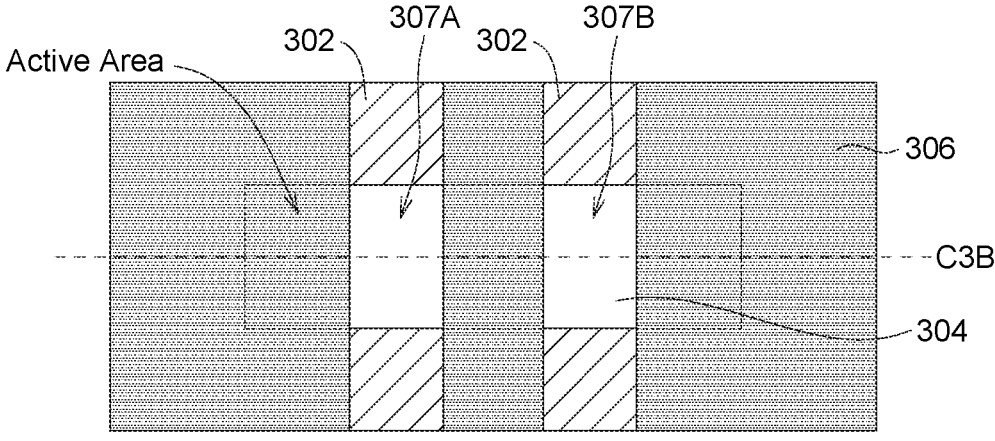
FIG. 3B(1)
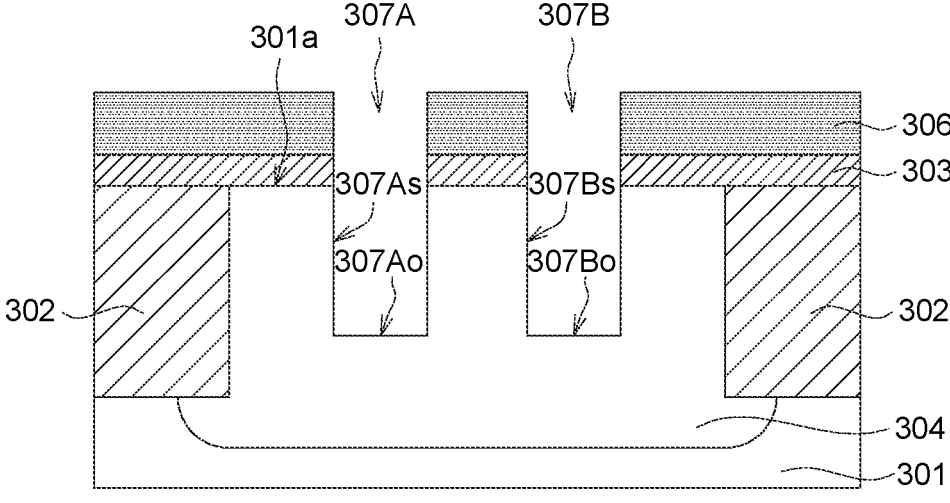
FIG. 3B(2)

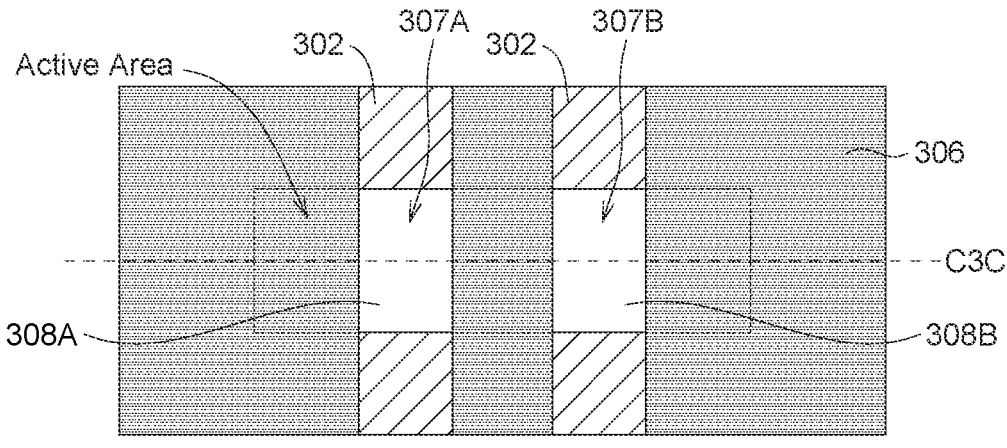
FIG. 3C(1)
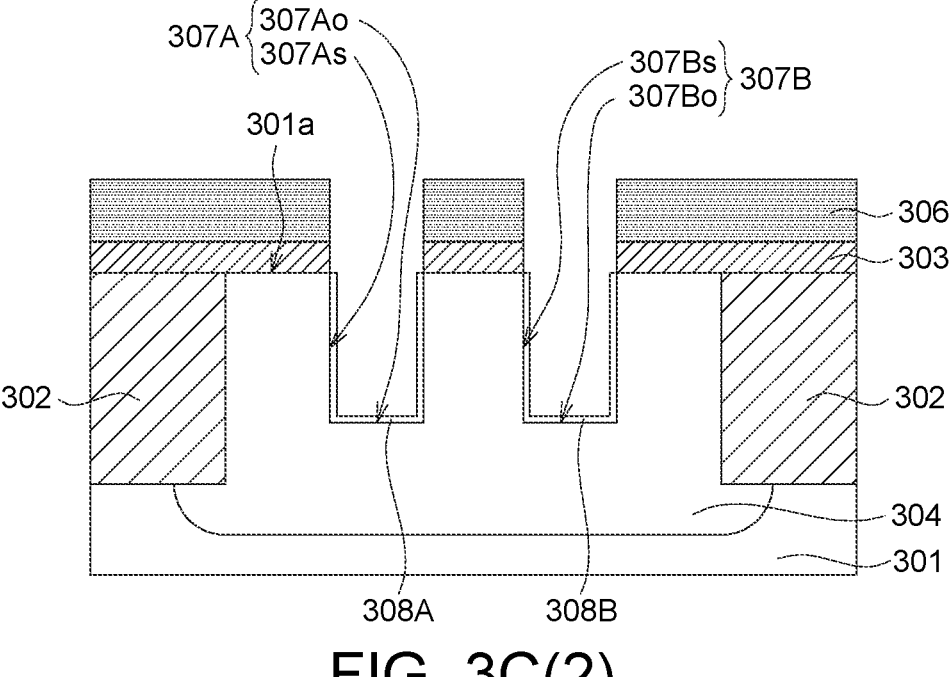
FIG. 3C(2)

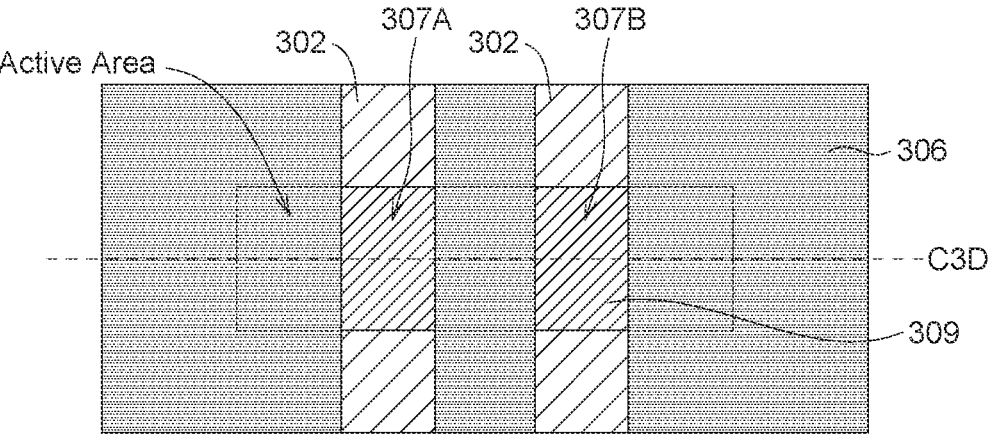
FIG. 3D(1)
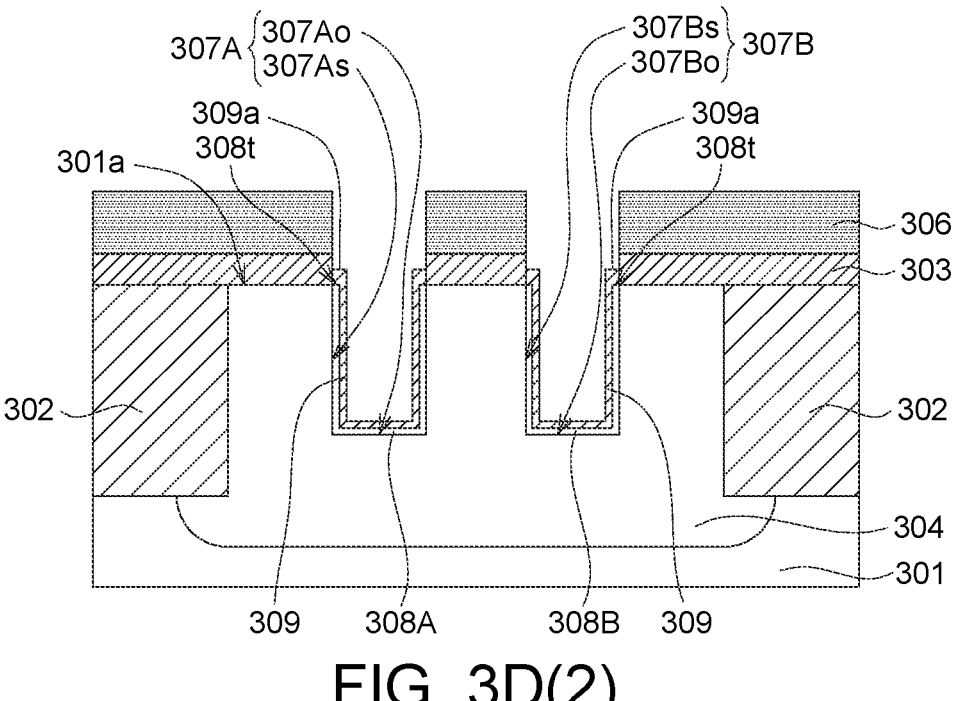
FIG. 3D(2)

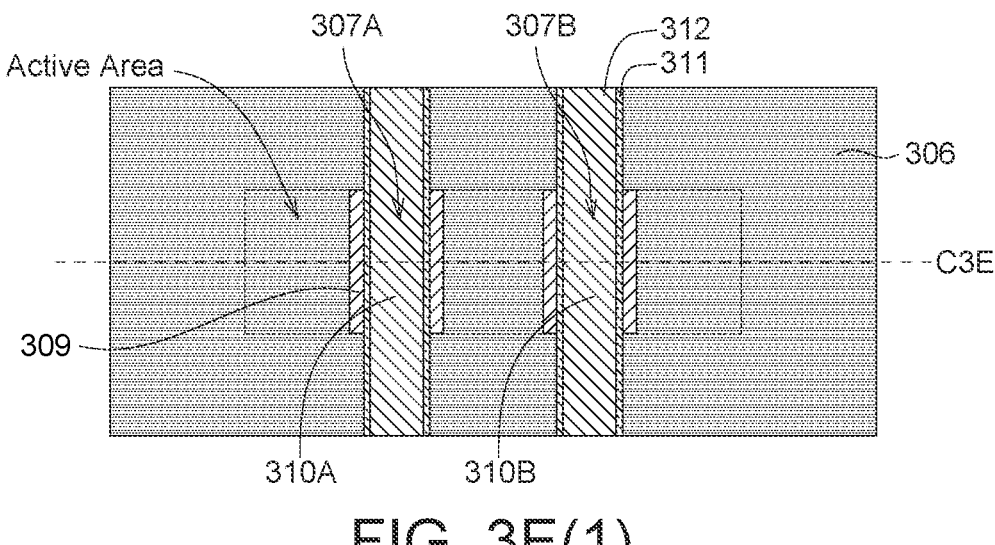
FIG. 3E(1)
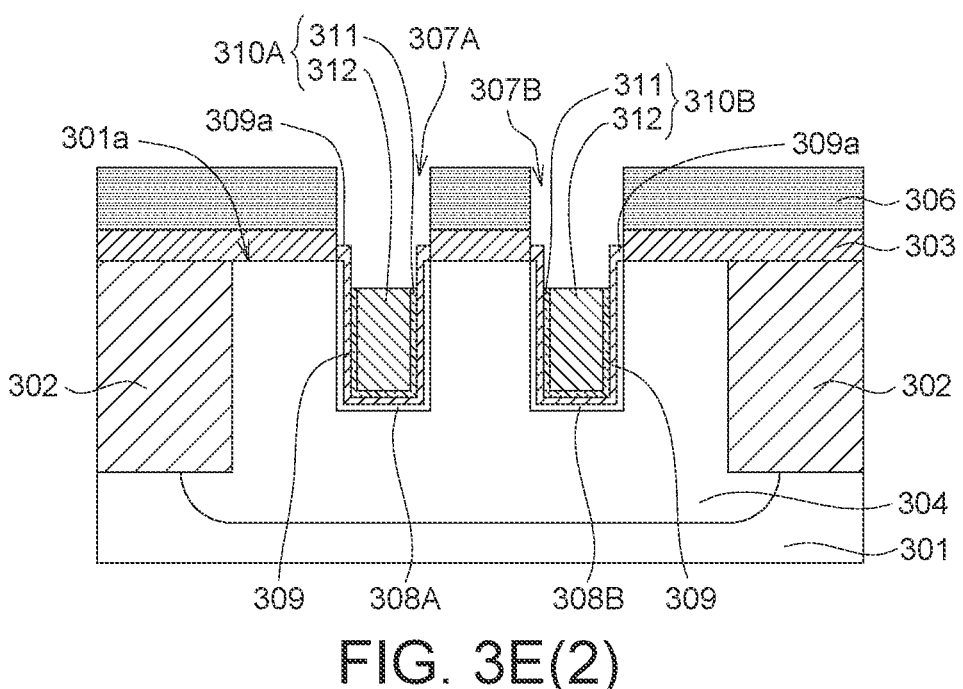
FIG. 3E(2)

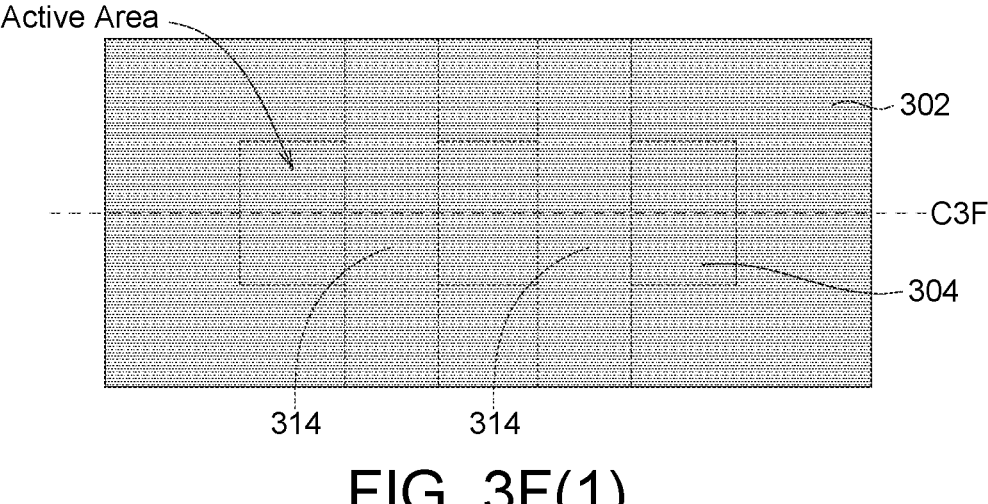
FIG. 3F(1)
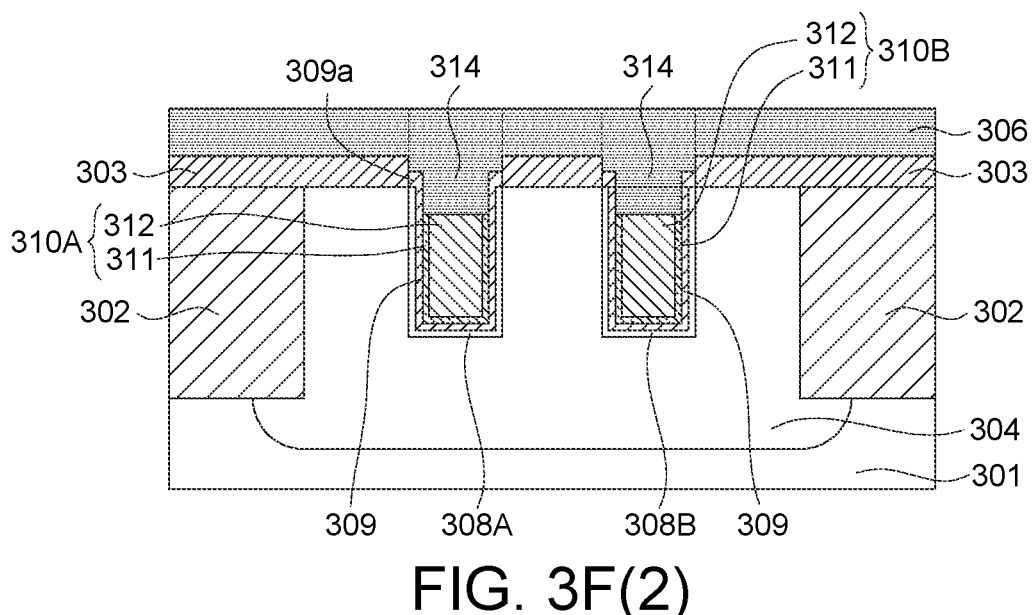
FIG. 3F(2)

Active Area
302
C3G
304
314A     314B
FIG. 3G(1)
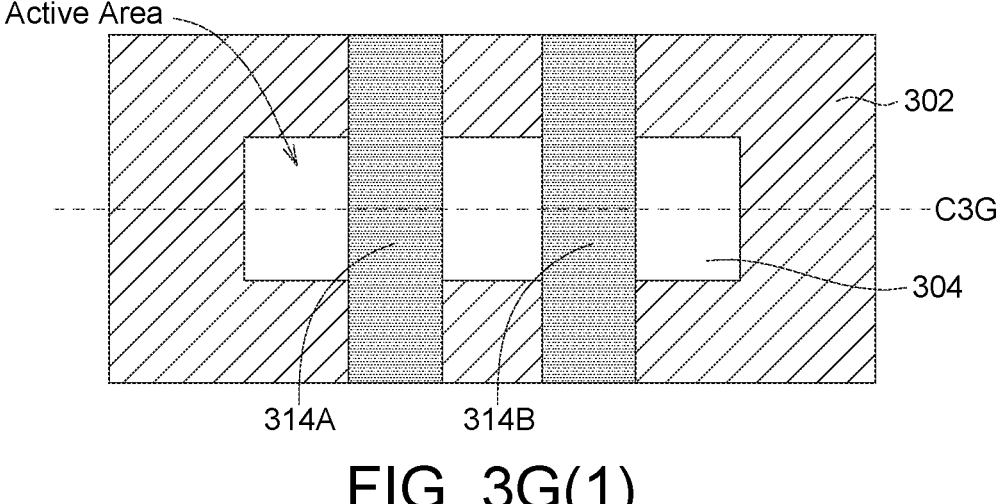
312
311 }310B
309a     314A     314B
310A { 312
        311
302
302
304
301
309     308A     308B     309
FIG. 3G(2)

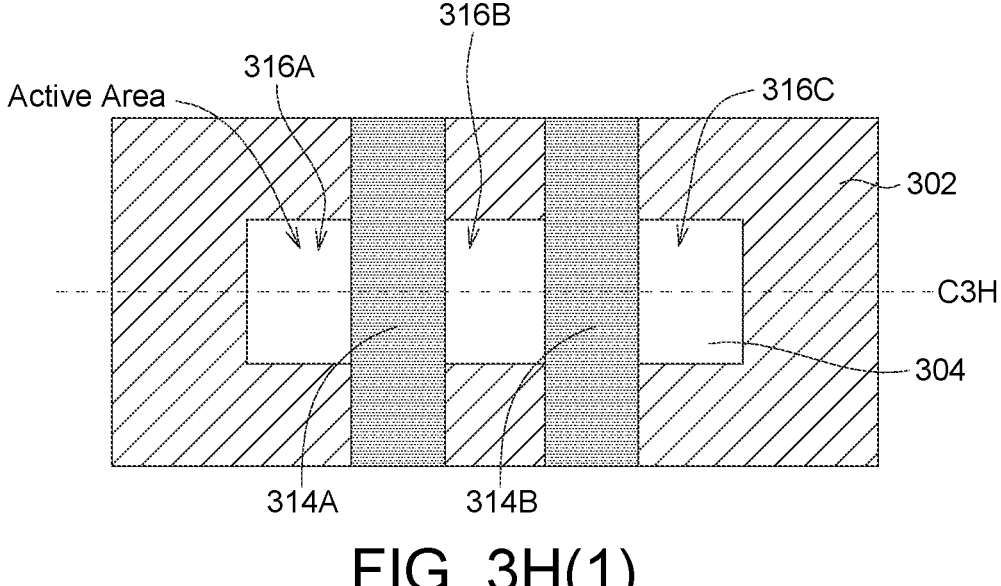
FIG. 3H(1)

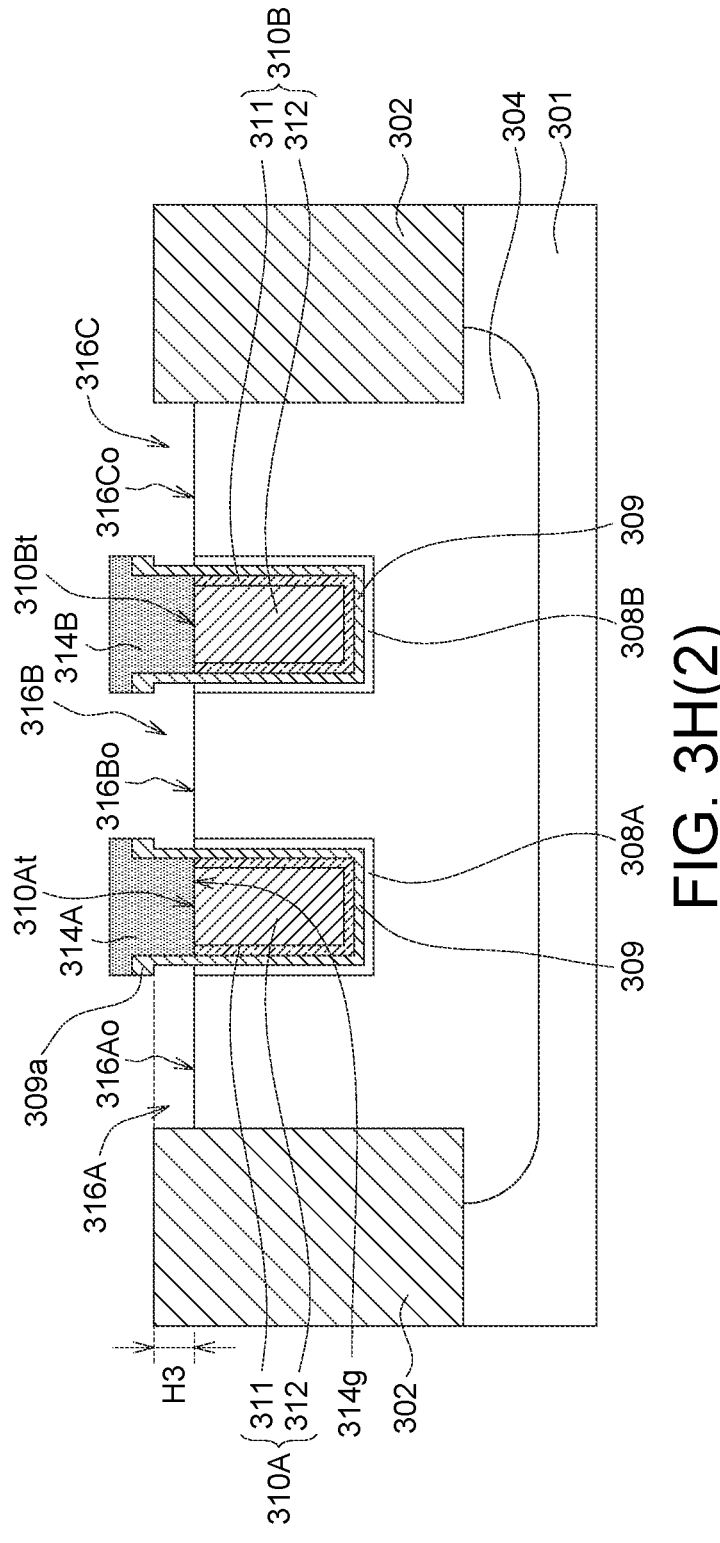
FIG. 3H(2)

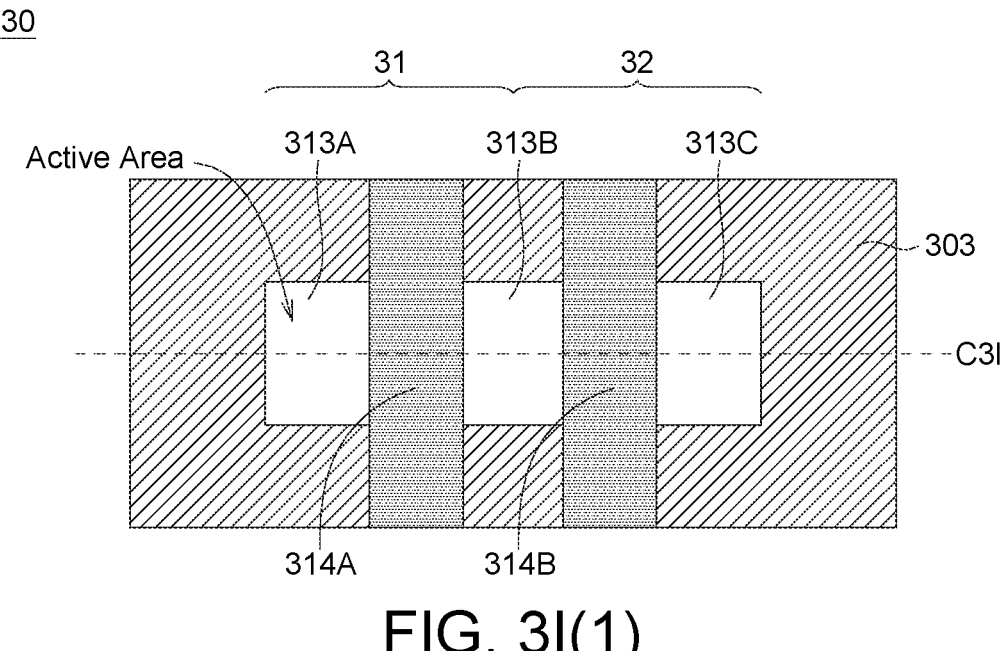
FIG. 3I(1)
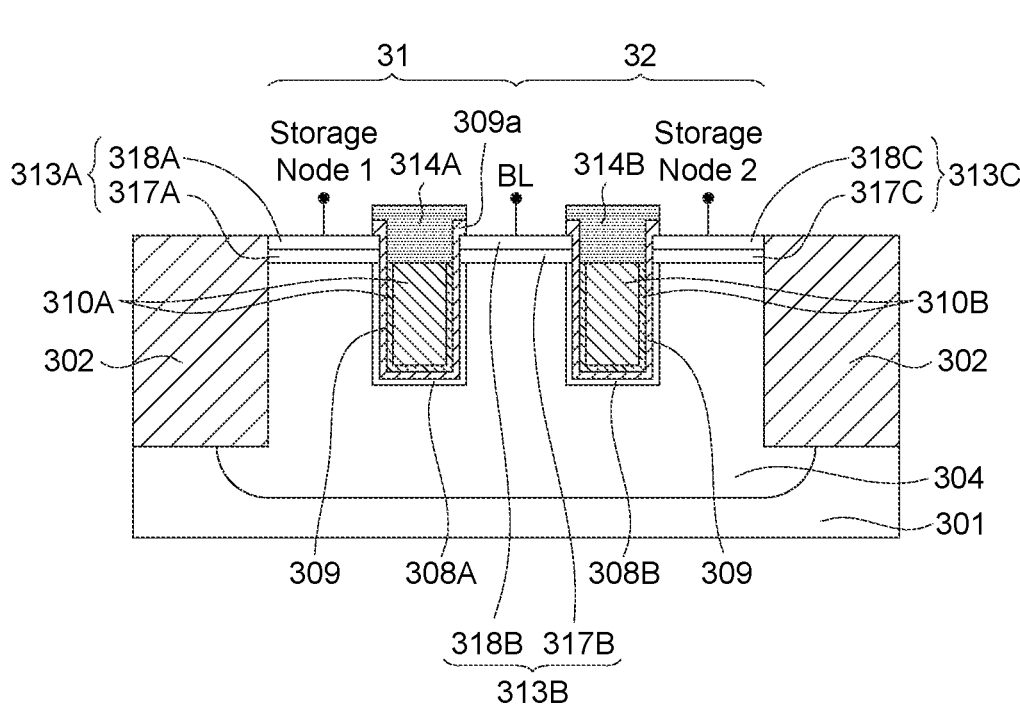
FIG. 3I(2)

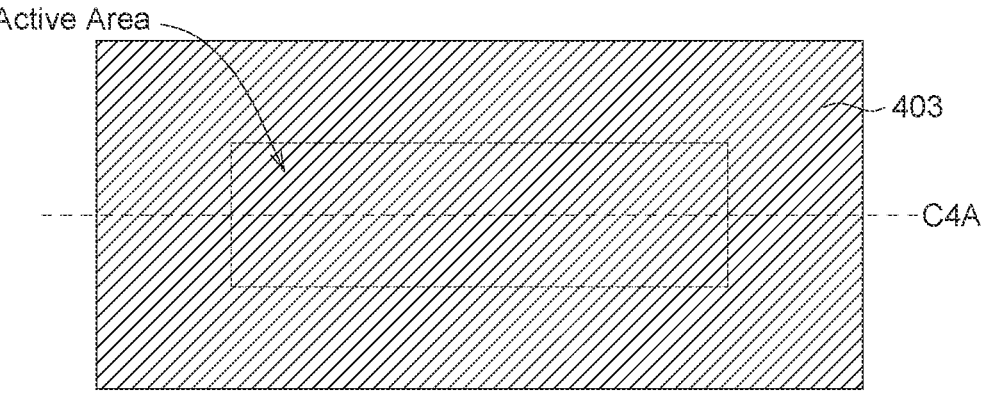
FIG. 4A(1)
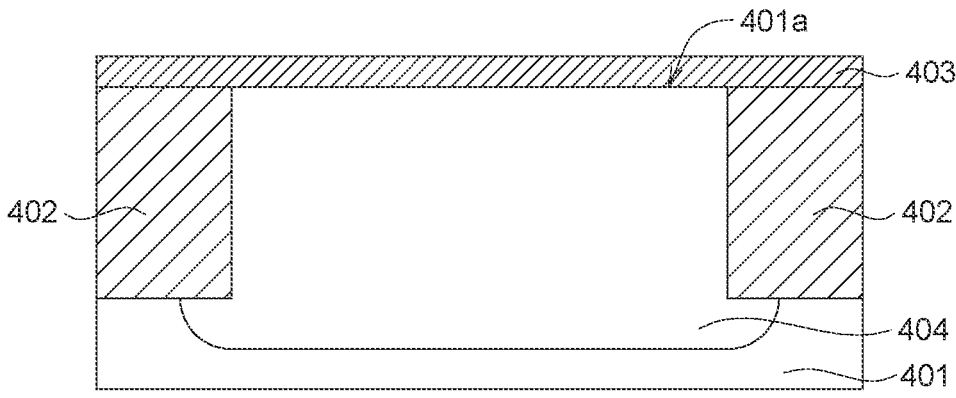
FIG. 4A(2)

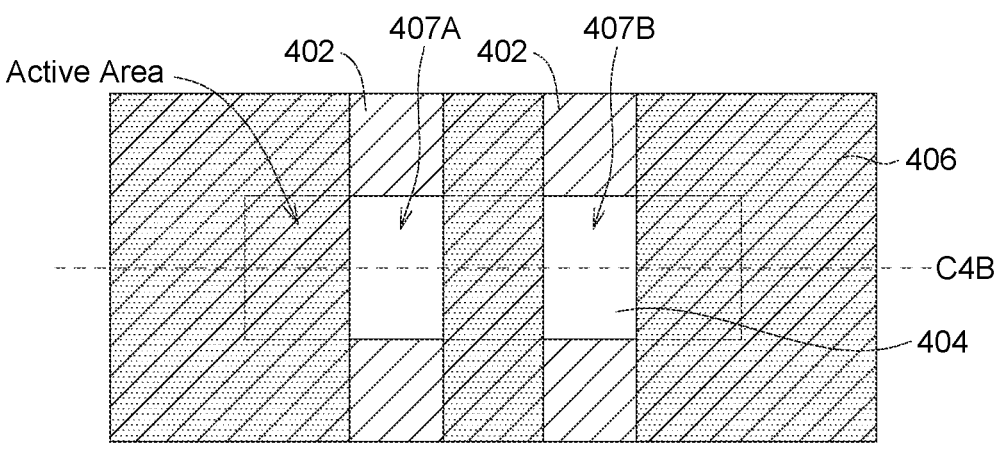
FIG. 4B(1)
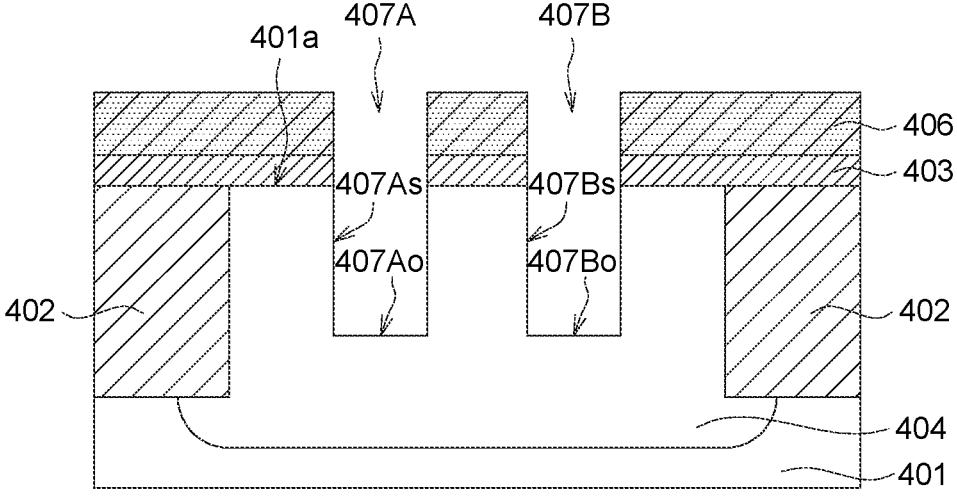
FIG. 4B(2)

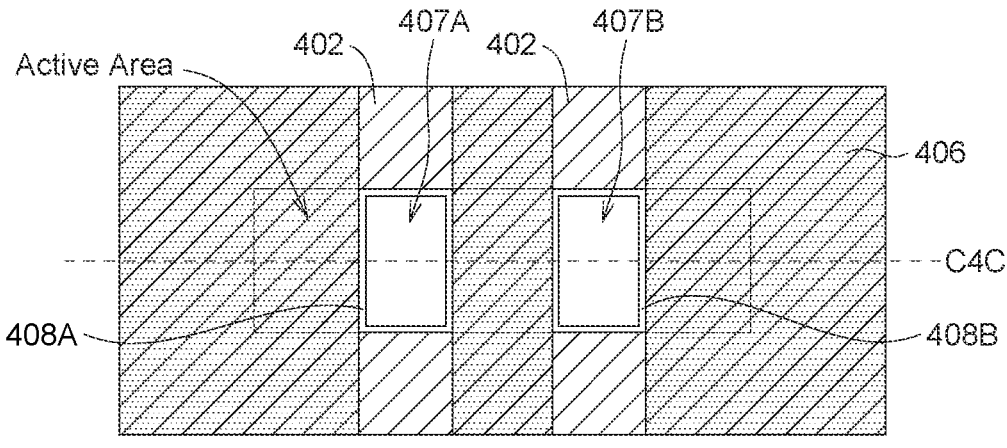
FIG. 4C(1)
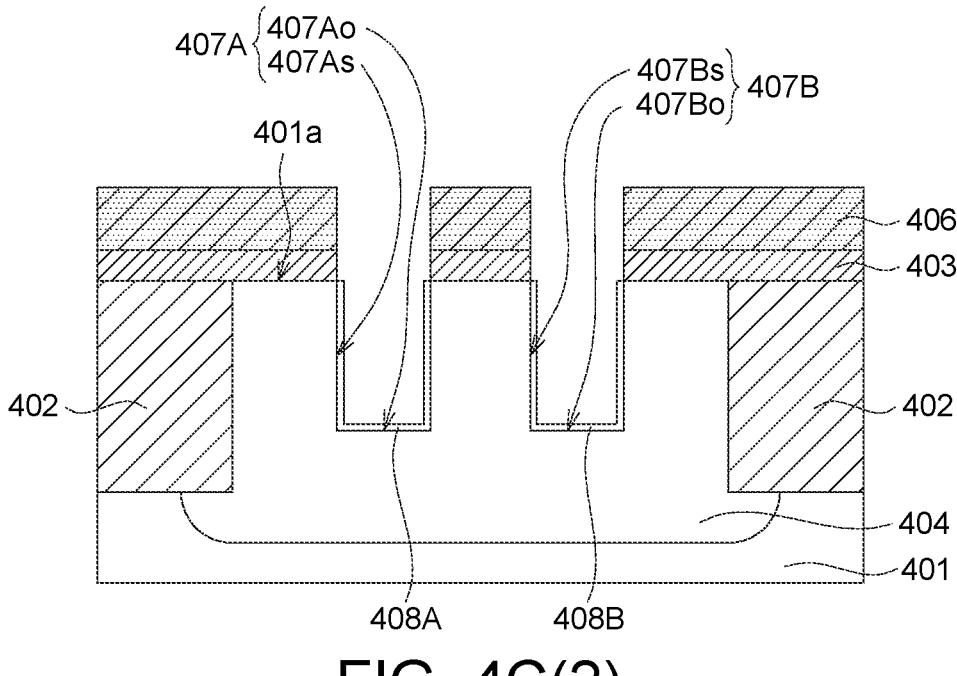
FIG. 4C(2)

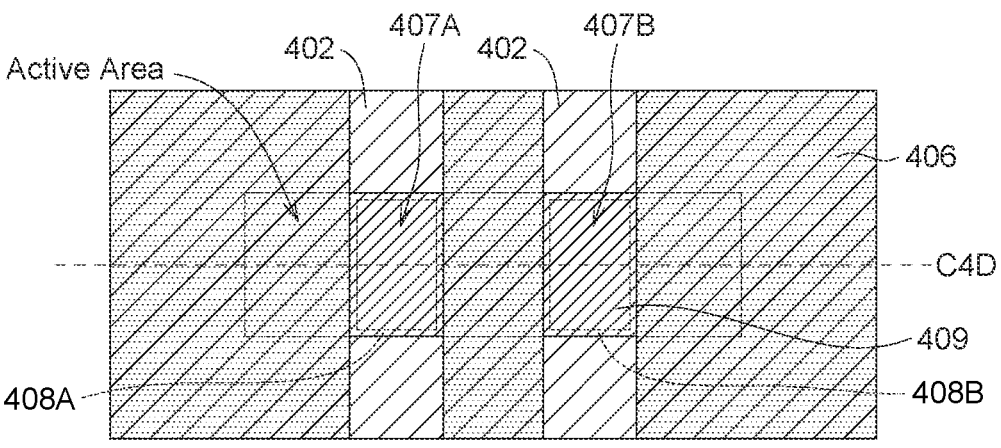
FIG. 4D(1)
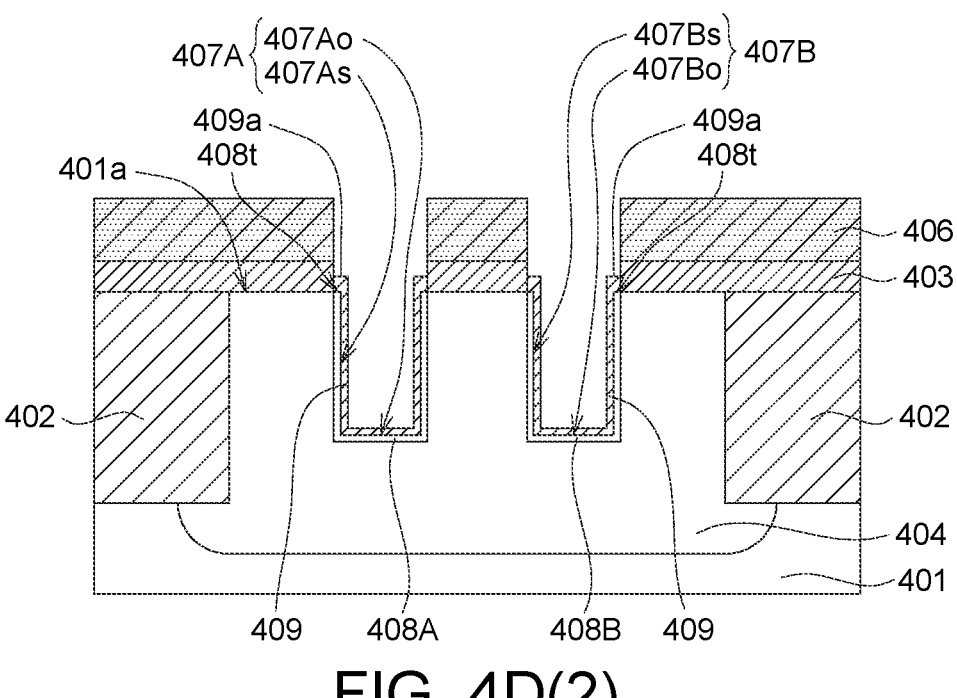
FIG. 4D(2)

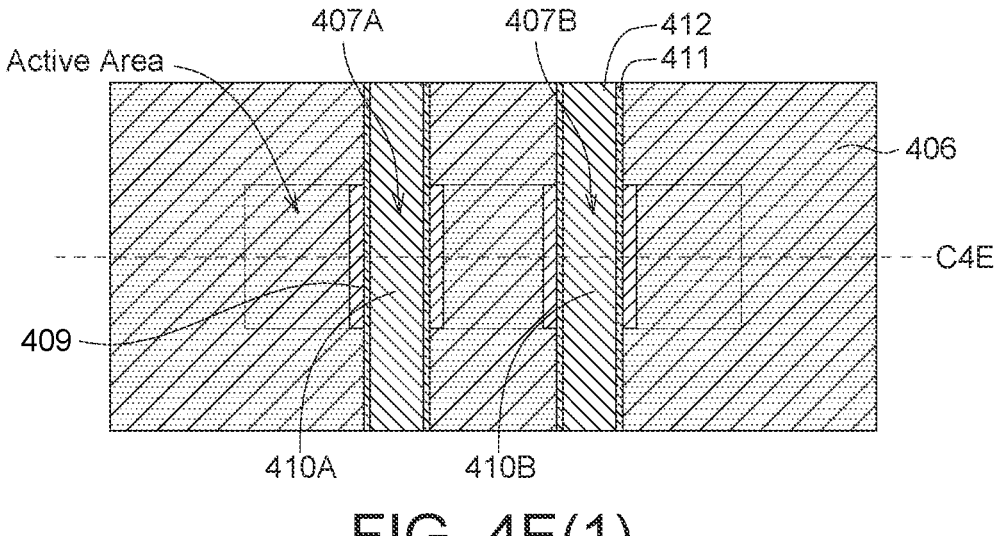
FIG. 4E(1)
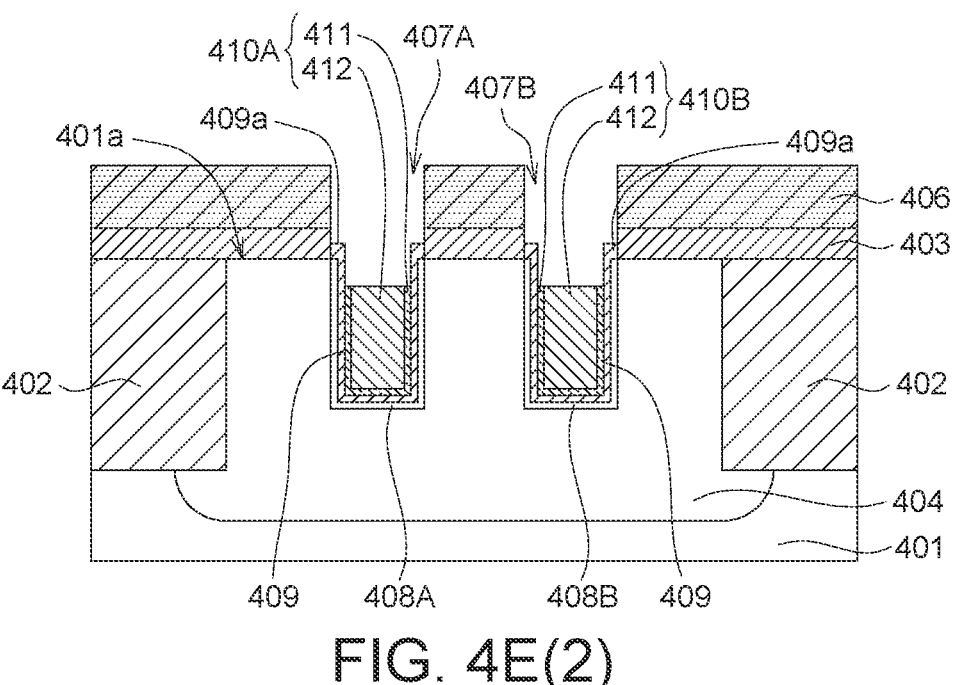
FIG. 4E(2)

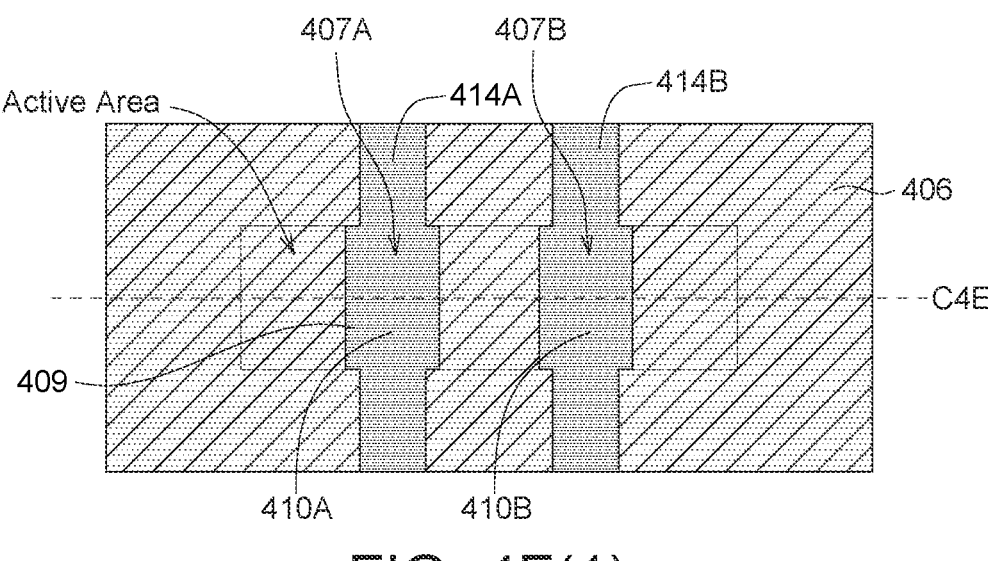
FIG. 4F(1)
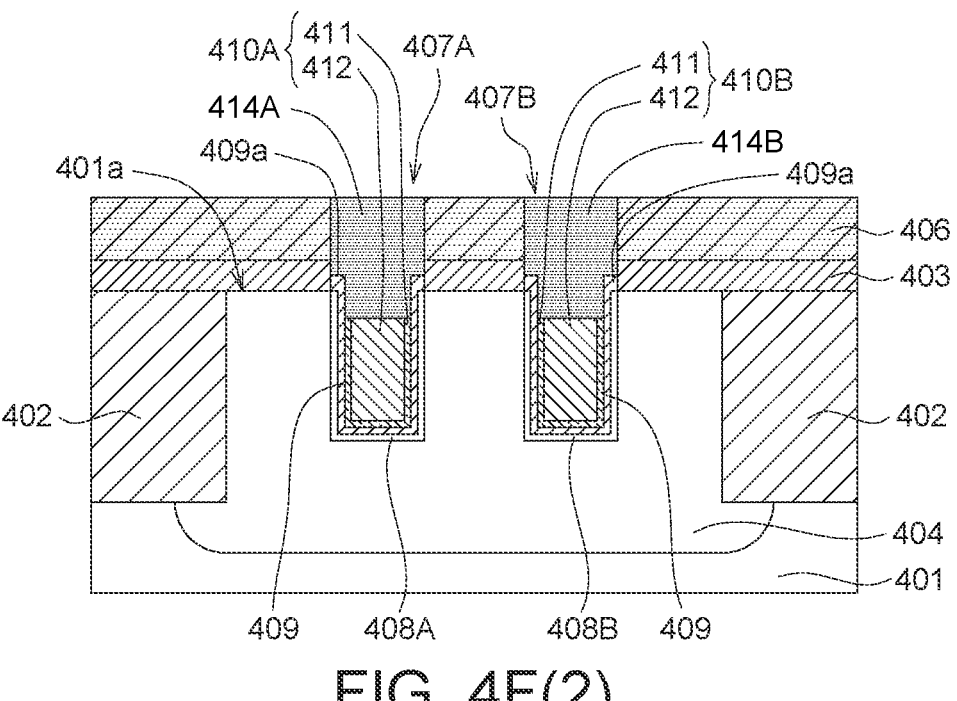
FIG. 4F(2)

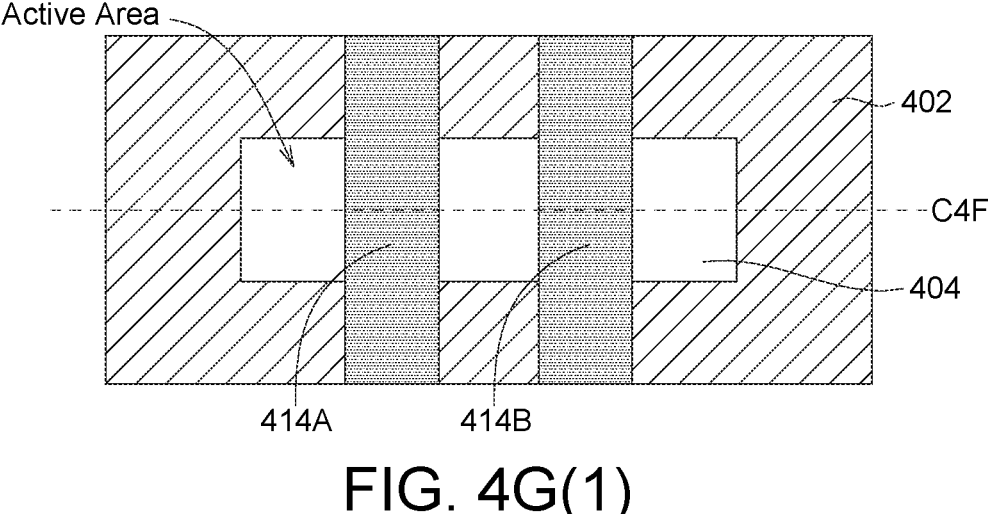
FIG. 4G(1)
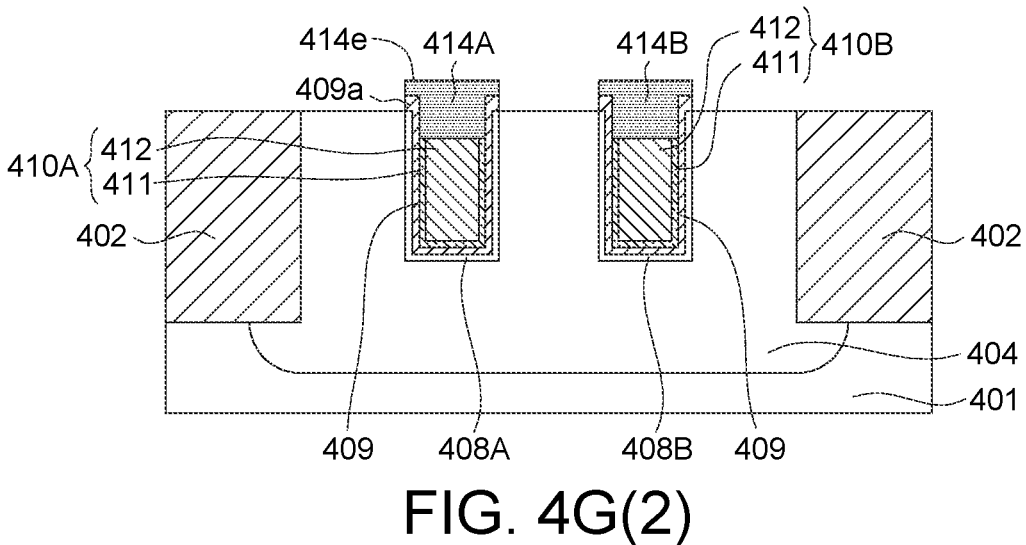
FIG. 4G(2)

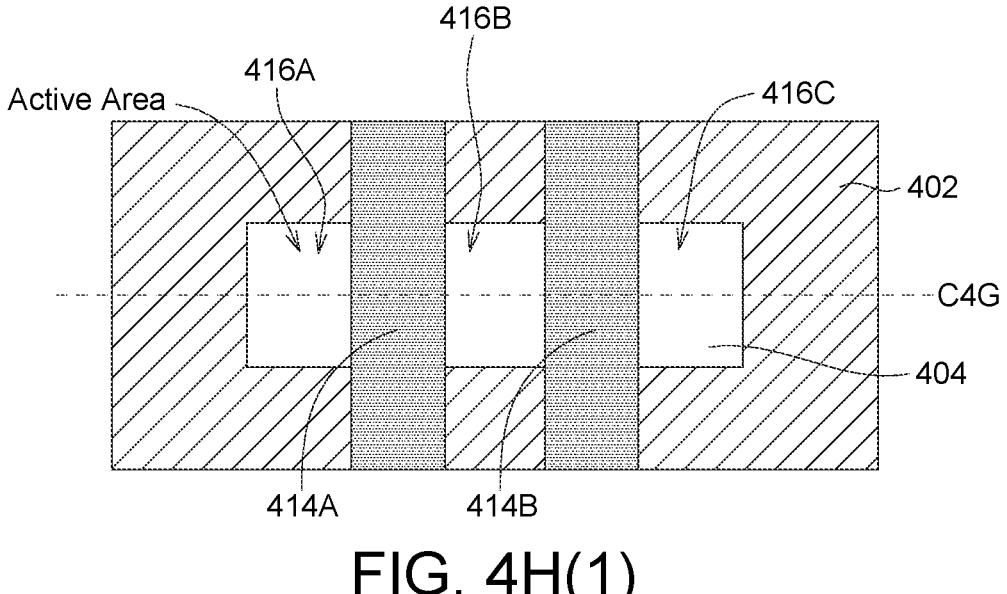
FIG. 4H(1)

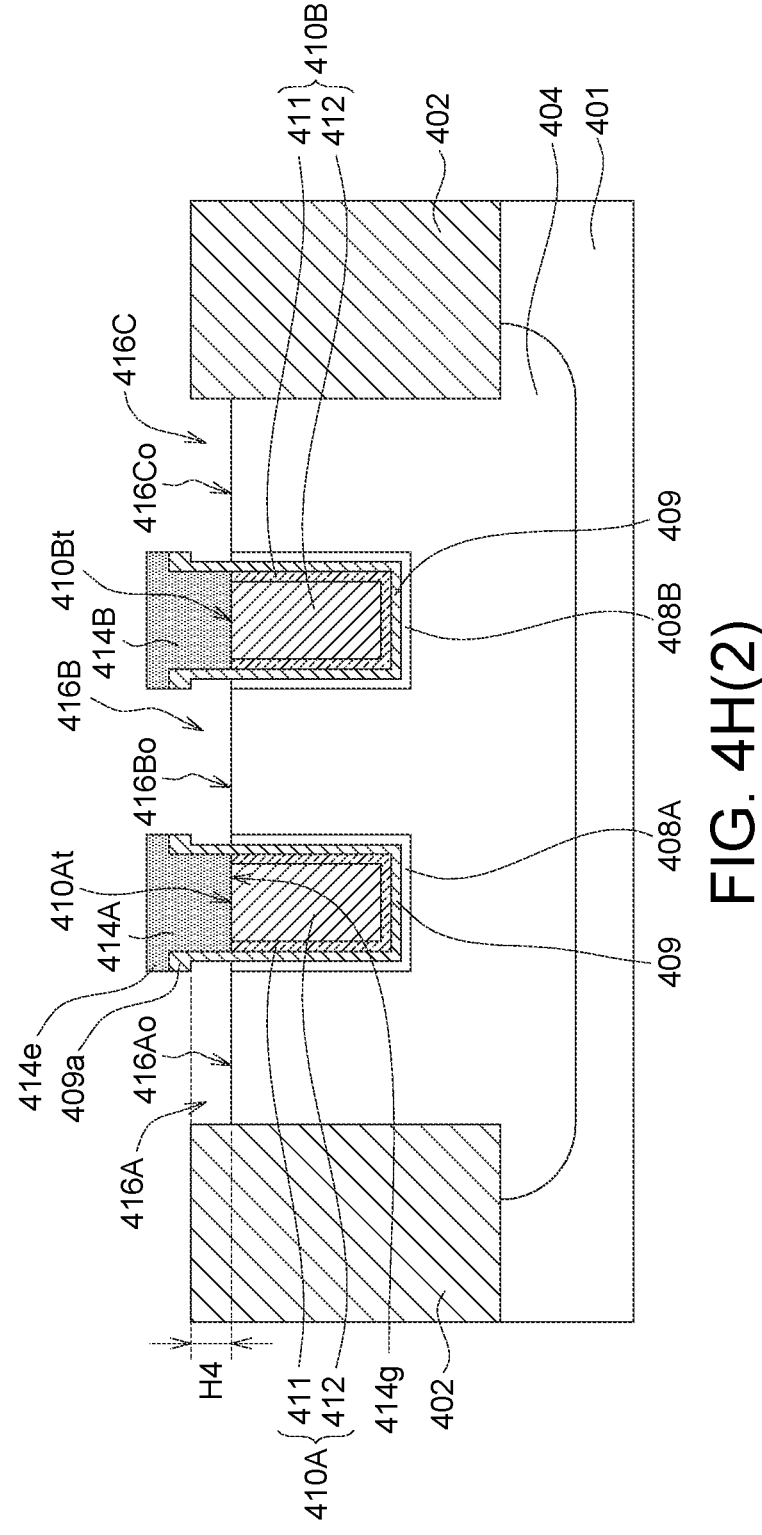
FIG. 4H(2)

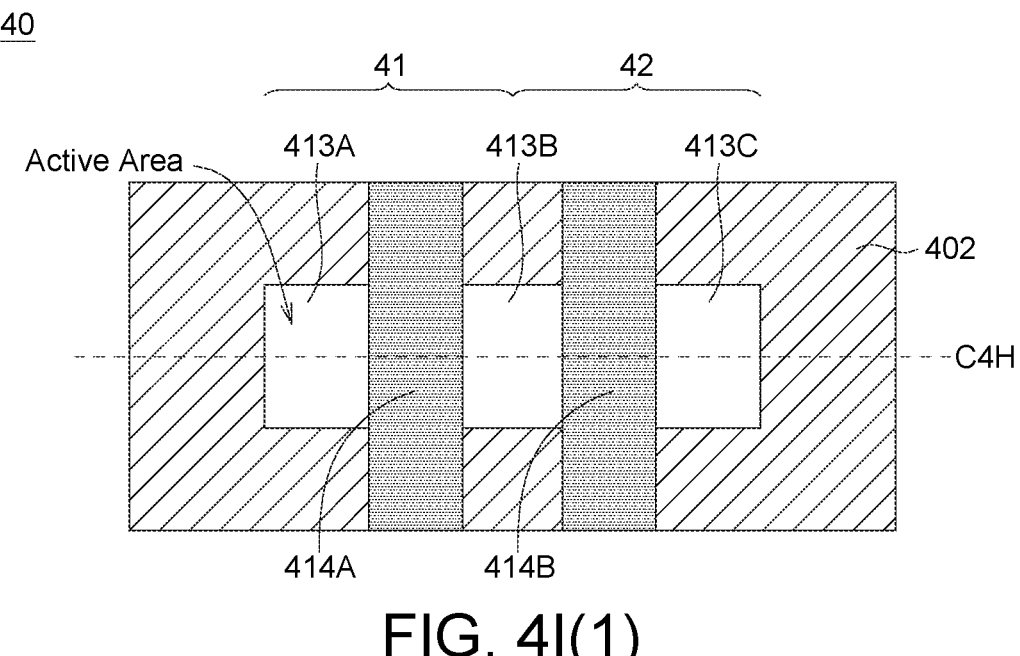
FIG. 4I(1)
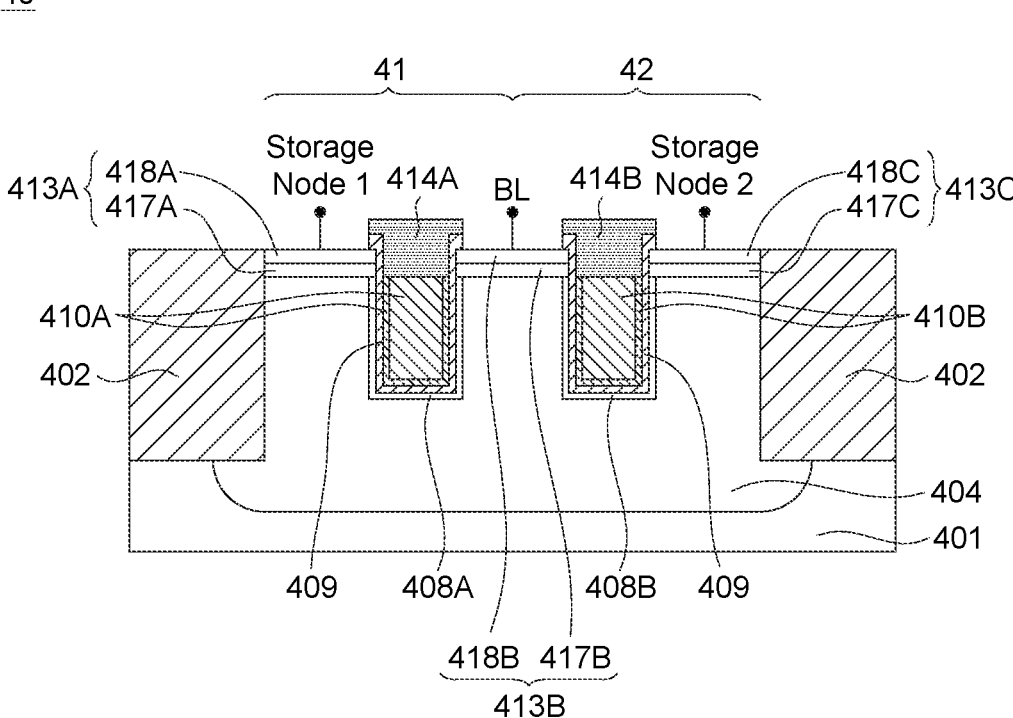
FIG. 4I(2)

METHOD FOR FORMING TRANSISTOR STRUCTURE WITH A VERTICALLY GROWN SOURCE AND DRAIN

This application claims the benefit of U.S. provisional application Ser. No. 63/224,921, filed Jul. 23, 2021, the subject matter of which is incorporated herein by reference.

BACKGROUND

Technical Field

The disclosure relates to a method for forming semiconductor device, and more particularly to a method for forming a transistor structure.

Description of Background

FIG. 1 is a cross section view illustrating a conventional access transistor 100 applied in a buried word line DRAM cell 10. As shown in FIG. 1, part or all of the gate region 101 is located under an original substrate surface 110*a* of a P-substrate 110. The gate region 101 includes a gate conductive region, a dielectric gate cap 101*b* disposed over the gate conductive region and a gate oxide layer 105 around or surrounded the gate region. The gate region 101 could comprise either the combination of metal region 101*a* (such as tungsten(W)) and titanium nitride 101*c* (TiN), or polysilicon material (not shown). A drain terminal 102 with N+ doped region 102*a* and a source terminal 103 with a N+ doped region 103*a* are located on the right hand side and the left hand side of the gate region 101. The drain terminal 102 and the source terminal 103 could further include a lightly doped region (n_LDD) 102*b* and 103*b* respectively. One of the drain terminal 102 and the source terminal 103 would be coupled to the capacitor of the DRAM cell (not shown) and the other one is coupled to the bit line BL. Moreover, the channel region of the access transistor (e.g. a vertical NMOS transistor) 100 coupling between the drain terminal 102 and the source terminal 103 will be around or surrounded the gate oxide layer 105.

Due to the fact that the drain terminal 102 and the source terminal 103 are formed by the ion implantation technology, the N+ doped region 102*a*/103*a* and the n_LDD region 102*b*/103*b* (especially the N+ doping region) of the drain terminal 102 and the source terminal 103 may be partially overlapped with the conductive region of the gate region 101, and will generate a higher electric field and then increases gate Inducing drain leakage (GIDL) current. On the other hand, many lattice damages may be created in the drain terminal 102 and the source terminal 103 by the ion implantation process. Since those lattice damages may be difficult to be fully recovered by a subsequent thermal treatment process, thus source or drain resistance may be increased and higher GIDL current may be further induced, so as to make the access transistor 100 having a worse storage node charges loss and a lower turn on current (Ion).

Furthermore, the threshold voltage of access transistor 100 is depending on the implant profile uniformity of a p_well 106 formed in the substrate 110. However, the conventional process adopts multiple implant steps and goes through an annealing process to form the drain terminal 102 and the source terminal 103 in the p_well, the doping profile of the p_well 106 may not be uniform and will inevitably introduce higher threshold voltage variation and increases channel resistance.

Therefore, there is a need of providing an advanced transistor structure to obviate the drawbacks encountered from the prior art.

SUMMARY

One aspect of the present disclosure is to provide a method for forming a transistor structure, wherein the method includes steps as follows: A substrate with an original surface is prepared. Next a gate conductive region is formed, wherein at least a portion of the gate conductive region is disposed below the original surface, and a bottom wall and sidewalls of the gate conductive region is surrounded by a gate dielectric layer. Then, a first conductive region is formed, wherein a bottom wall of the first conductive region is aligned or substantially aligned with a top wall of the gate conductive region.

In one embodiment of the present disclosure, the forming of the gate conductive region includes steps of using a nitride hard mask layer to form a gate recess for the gate conductive region; forming the gate dielectric layer in the gate recess; and forming the gate conductive region in the gate recess.

In one embodiment of the present disclosure, the forming of the first conductive region includes steps of removing the nitride hard mask layer; etching the substrate to form a first recess; and forming the first conductive region by a selective growth process.

In one embodiment of the present disclosure, the selective growth process applies a selective epitaxy growth (SEG) method or an atomic layer deposition (ALD) method.

In one embodiment of the present disclosure, the method further includes steps of forming a channel region before forming the gate dielectric layer.

In one embodiment of the present disclosure, the forming of the channel region includes steps of depositing a p-type doped poly-silicon plug or oxide in the gate recess; and thermal annealing the p-type doped poly-silicon plug or oxide to form the channel region underneath the gate recess.

In one embodiment of the present disclosure, the channel region is formed by a deposition process on a bottom wall and a sidewall of the gate recesses.

Another aspect of the present disclosure is to provide a method for forming a transistor structure, wherein the method includes steps as follows: A substrate with an original surface is prepared. Next a gate conductive region is formed, wherein at least a portion of the gate conductive region is disposed below the original surface, and a bottom wall and sidewalls of the gate conductive region is surrounded by a gate dielectric layer; the forming of the gate conductive region includes steps of using a hard mask oxide layer to form a gate recess for the gate conductive region; forming the gate dielectric layer in the gate recess; and forming the gate conductive region in the gate recess. Then, a first conductive region is formed, wherein a bottom wall of the first conductive region is aligned or substantially aligned with a top wall of the gate conductive region.

In one embodiment of the present disclosure, the forming of the first conductive region includes steps of removing the hard mask oxide layer; etching the substrate to form a first recess; and forming the first conductive region by a selective growth process.

In one embodiment of the present disclosure, the selective growth process applies a SEG method or an ALD method.

In one embodiment of the present disclosure, the method further includes steps of forming a channel region before forming the gate dielectric layer.

In one embodiment of the present disclosure, the forming of the channel region includes steps of depositing a p-type doped poly-silicon plug or oxide in the gate recess; and thermal annealing the p-type doped poly-silicon plug or oxide to form the channel region underneath the gate recess.

In one embodiment of the present disclosure, the channel region is formed by a deposition process on a bottom wall and a sidewall of the gate recesses.

BRIEF DESCRIPTION OF THE DRAWINGS

The above objects and advantages of the present disclosure will become more readily apparent to those ordinarily skilled in the art after reviewing the following detailed description and accompanying drawings, in which:

FIG. 2A(1) is a top view illustrating a partial structure of a semiconductor substrate used for forming NMOS transistor of a buried word line DRAM cell, according to one embodiment of the present disclosure.

FIG. 2A(2) is a cross-sectional view taken along the cutting line C2A as depicted in FIG. 2A(1).

FIG. 2B(1) is a top view illustrating a partial structure after the gate recesses are formed in the semiconductor substrate.

FIG. 2B(2) is a cross-sectional view taken along the cutting line C2B as depicted in FIG. 2B(1).

FIG. 2C(1) is a top view illustrating a partial structure after channel regions are respectively formed in the gate recesses.

FIG. 2C(2) is a cross-sectional view taken along the cutting line C2C as depicted in FIG. 2C(1).

FIG. 2D(1) is a top view illustrating a partial structure after the gate dielectric layer is formed in the gate recesses.

FIG. 2D(2) is a cross-sectional view taken along the cutting line C2D as depicted in FIG. 2D(1).

FIG. 2E(1) is a top view illustrating a partial structure after the gate conductive regions are respectively formed in the gate recesses.

FIG. 2E(2) is a cross-sectional view taken along the cutting line C2E as depicted in FIG. 2E(1).

FIG. 2F(1) is a top view illustrating a partial structure after the dielectric material is formed to fill the top portions of the gate recesses.

FIG. 2F(2) is a cross-sectional view taken along the cutting line C2F as depicted in FIG. 2F(1).

FIG. 2G(1) is a top view illustrating a partial structure after the nitride hard mask layer is removed and the dielectric gate caps are formed on the gate conductive regions.

FIG. 2G(2) is a cross-sectional view taken along the cutting line C2G as depicted in FIG. 2G(1).

FIG. 2H(1) is a top view illustrating a partial structure after a first recess, a second recess and a third recess are formed in the semiconductor substrate.

FIG. 2H(2) is a cross-sectional view taken along the cutting line C2H as depicted in FIG. 2H(1).

FIG. 2I(1) is a top view illustrating a partial structure after a first conductive region, a second conductive region and a third conductive region are respectively formed in the first recess, the second recess and the third recess.

FIG. 2I(2) is a cross-sectional view taken along the cutting line C2I as depicted in FIG. 2I(1).

FIG. 2J(1) is a cross-sectional view for another embodiment of the present invention which is similar to FIG. 2H(2).

FIG. 2J(2) is a cross-sectional view for the another embodiment of the present invention which is similar to FIG. 2I(2).

FIG. 2K(1) is the top view corresponding to FIG. 2J(1) when such process is applied to the DRAM array structure.

FIG. 2K(2) is the top view corresponding to FIG. 2J(2) when such process is applied to the DRAM array structure.

FIG. 3A(1) is a top view illustrating a partial structure of a semiconductor substrate used for forming NMOS transistor of a buried word line DRAM cell, according to one embodiment of the present disclosure.

FIG. 3A(2) is a cross-sectional view taken along the cutting line C3A as depicted in FIG. 3A(1).

FIG. 3B(1) is a top view illustrating a partial structure after the gate recesses are formed in the semiconductor substrate.

FIG. 3B(2) is a cross-sectional view taken along the cutting line C3B as depicted in FIG. 3B(1).

FIG. 3C(1) is a top view illustrating a partial structure after channel regions are respectively formed in the gate recesses.

FIG. 3C(2) is a cross-sectional view taken along the cutting line C3C as depicted in FIG. 3C(1).

FIG. 3D(1) is a top view illustrating a partial structure after the gate dielectric layer is formed in the gate recesses.

FIG. 3D(2) is a cross-sectional view taken along the cutting line C2D as depicted in FIG. 3D(1).

FIG. 3E(1) is a top view illustrating a partial structure after the gate conductive regions are respectively formed in the gate recesses.

FIG. 3E(2) is a cross-sectional view taken along the cutting line C3E as depicted in FIG. 3E(1).

FIG. 3F(1) is a top view illustrating a partial structure after the dielectric material is formed to fill the top portions of the gate recesses.

FIG. 3F(2) is a cross-sectional view taken along the cutting line C3F as depicted in FIG. 3F(1).

FIG. 3G(1) is a top view illustrating a partial structure after the nitride hard mask layer is removed and the dielectric gate caps are formed on the gate conductive regions.

FIG. 3G(2) is a cross-sectional view taken along the cutting line C3G as depicted in FIG. 3G(1).

FIG. 3H(1) is a top view illustrating a partial structure after a first recess, a second recess and a third recess are formed in the semiconductor substrate.

FIG. 3H(2) is a cross-sectional view taken along the cutting line C3H as depicted in FIG. 3H(1).

FIG. 3I(1) is a top view illustrating a partial structure after a first conductive region, a second conductive region and a third conductive region are respectively formed in the first recess, the second recess and the third recess.

FIG. 3I(2) is a cross-sectional view taken along the cutting line C3I as depicted in FIG. 3I(1).

FIG. 4A(1) is a top view illustrating a partial structure of a semiconductor substrate used for forming vertical NMOS transistor of a buried word line DRAM cell, according to one embodiment of the present disclosure.

FIG. 4A(2) is a cross-sectional view taken along the cutting line C4A as depicted in FIG. 4A(1).

FIG. 4B(1) is a top view illustrating a partial structure after the gate recesses are formed in the semiconductor substrate.

FIG. 4B(2) is a cross-sectional view taken along the cutting line C3B as depicted in FIG. 4B(1).

FIG. 4C(1) is a top view illustrating a partial structure after channel regions are respectively formed in the gate recesses.

FIG. 4C(2) is a cross-sectional view taken along the cutting line C3C as depicted in FIG. 4C(1).

FIG. 4D(1) is a top view illustrating a partial structure after the gate dielectric layer is formed in the gate recesses.

FIG. 4D(2) is a cross-sectional view taken along the cutting line C4D as depicted in FIG. 4D(1).

FIG. 4E(1) is a top view illustrating a partial structure after the gate conductive regions are respectively formed in the gate recesses.

FIG. 4E(2) is a cross-sectional view taken along the cutting line C4E as depicted in FIG. 4E(1).

FIG. 4F(1) is a top view illustrating a partial structure after the dielectric gate caps are formed to fill in the gate recesses.

FIG. 4F(2) is a cross-sectional view taken along the cutting line C4F as depicted in FIG. 4F(1).

FIG. 4G(1) is a top view illustrating a partial structure after the hard mask oxide layer is removed.

FIG. 4G(2) is a cross-sectional view taken along the cutting line C4G as depicted in FIG. 4G(1).

FIG. 4H(1) is a top view illustrating a partial structure after a first recess, a second recess and a third recess are formed in the semiconductor substrate.

FIG. 4H(2) is a cross-sectional view taken along the cutting line C4H as depicted in FIG. 4H(1).

FIG. 4I(1) is a top view illustrating a partial structure after a first conductive region, a second conductive region and a third conductive region are respectively formed in the first recess, the second recess and the third recess.

FIG. 4I(2) is a cross-sectional view taken along the cutting line C4I as depicted in FIG. 4I(1).

DETAILED DESCRIPTION

Figure 1:
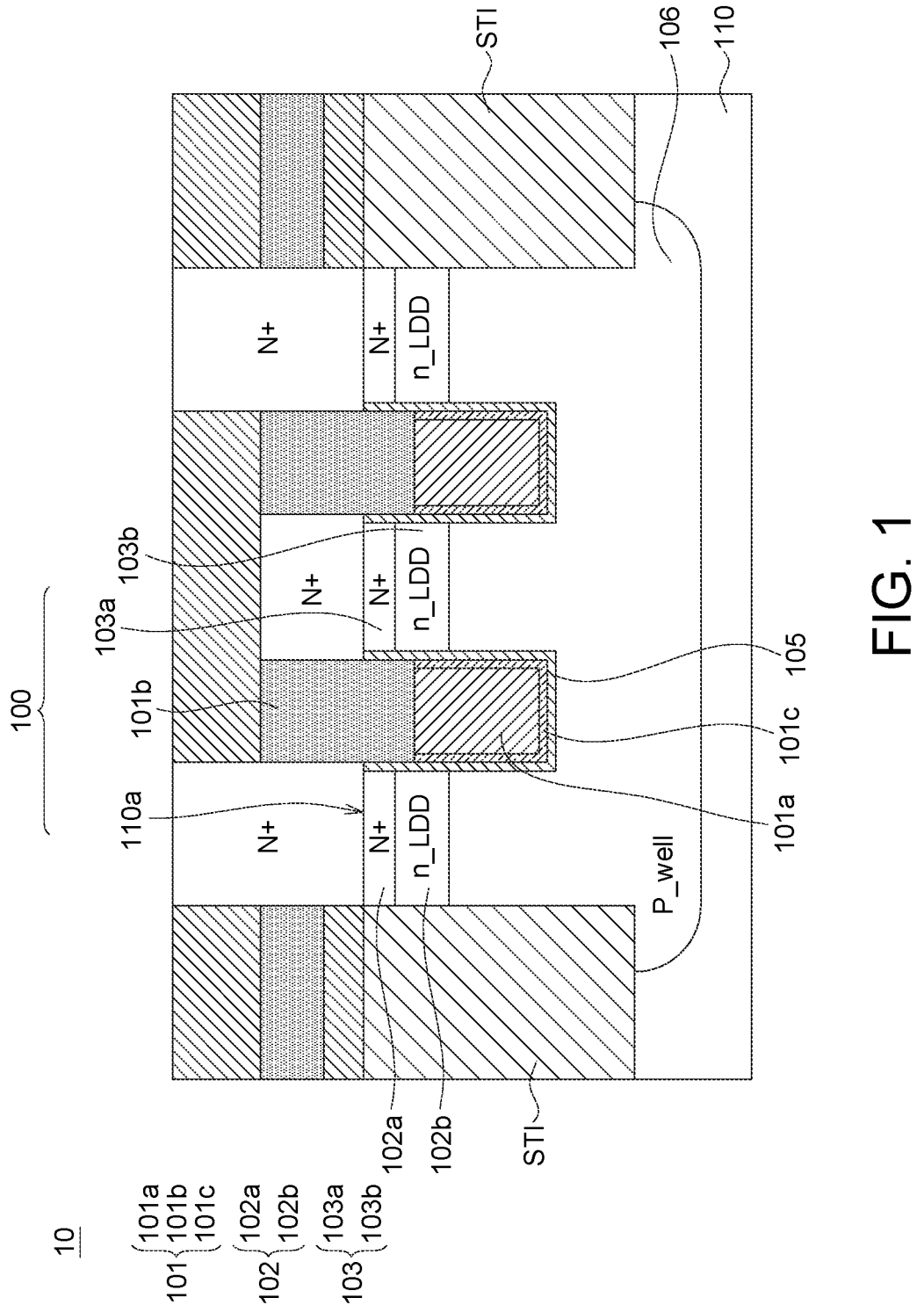
FIG. 1 is a cross section view illustrating a conventional access transistor applied in a buried word line DRAM cell.

The embodiments as illustrated below provide a transistor structure with decreased GIDL current, less threshold voltage variation and lower channel resistance and a method for fabricating the same. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

The following embodiments are described by forming a transistor structure for a semiconductor device. In some embodiments of the present disclosure, the transistor structure adopted as an example can be (but not limited to) an a U-groove NMOS transistor for used in a buried word line DRAM cell; a structure for a PMOS transistor (not shown) can be derived similarly except which has oppositely doped or formed materials in contrast to those of the NMOS transistor.

Embodiment 1

According to one embodiment of the present disclosure, the method for forming a buried word line DRAM cell 20 having at least one access transistor includes steps as follows:

Step S21: preparing a semiconductor substrate with an original surface;

Step S22: forming a gate conductive region below the original surface of the semiconductor substrate, and the forming of the gate conductive region 210A includes sub-steps S221-S225;

Step S221: use a patterned nitride hard mask layer to form a gate recess in the semiconductor substrate;

Step S222: forming a channel region in the gate recess, wherein the channel layer is a doped layer within the semiconductor substrate (optionally);

Step S223: forming a gate dielectric layer in the gate recess;

Step S224: forming the gate conductive region in the gate recess and surrounded by the gate dielectric layer; and Step S225: forming the gate cap region; and Step S23: forming a first conductive region wherein a bottom wall of the first conductive region is aligned or substantially aligned with a top wall of the gate conductive region. The forming of the conductive regions includes sub-steps S231-S233:

Step S231: revealing the original surface of the substrate;

Step S232: etching the revealed semiconductor substrate to form a first recess for the first conductive region; and Step S233: forming the first conductive region by a selective growth method (e.g., a selective epitaxy growth (SEG) method or an atomic layer deposition (ALD) method).

Referring to Step S21: preparing a semiconductor substrate 201 with an original surface 201a. FIG. 2A(1) is a top view illustrating a partial structure of the semiconductor substrate 201 used for forming the NMOS transistors of the buried word line DRAM cells, according to one embodiment of the present disclosure. FIG. 2A(2) is a cross-sectional view taken along the cutting line C2A as depicted in FIG. 2A(1).

In the present embodiment, the semiconductor substrate 201 includes a silicon layer, such as a poly-silicon layer or an amorphous silicon layer. As shown in FIGS. 2A(1) and 2A(2), at least one shallow trench isolator (STI) 202 is then formed in the semiconductor substrate 201 to define an active area for forming the NMOS transistors, such that the active area is surrounded by the STI 202. A pad oxide layer 203 is formed on the STI 202 and the original surface 201a of the semiconductor substrate 201, wherein the pad oxide layer 203 may include silicon oxide, silicon oxy-nitride or the combination thereof. Then, use deep n_well implantation, p_well implantation, threshold implantation and thermal annealing process to form DRAM array cell well profile (including a p_well 204 in the semiconductor substrate 201).

Referring to Step S22: forming a gate conductive region 210A below the original surface 201a of the semiconductor substrate 201, the forming of the gate conductive region 210A includes sub-steps S221-S225 described as follows:

Referring to Step S221: patterning a nitride hard mask layer 206 and removing the unwanted material to form gate recesses (such as, the gate recesses 207A and 207B) in the semiconductor substrate 201, wherein FIG. 2B(1) is a top view illustrating a partial structure after the gate recesses 207A and 207B are formed in the semiconductor substrate 201, and FIG. 2B(2) is a cross-sectional view taken along the cutting line C2B as depicted in FIG. 2B(1).

The forming of the gate recesses 207A and 207B includes steps as follows: Firstly, a patterned nitride hard mask layer 206 having at least one opening is formed on the pad oxide layer 203, and at least one etching process using the patterned nitride hard mask layer 206 as an etching mask is performed to remove portions of the pad oxide layer 203 and portions of the semiconductor substrate 201, so as to form the gate recesses 207A and 207B within the active area.

Alternatively, a signal photo-resist patterning (etching) process is performed to remove portions of the nitride hard mask layer 206, portions of the pad oxide layer 203 and portions of the semiconductor substrate 201, so as to define the gate recesses 207A and 207B within the active area.

Referring to Step S222: forming a channel region (such as the channel region 208A) in the gate recess (such as, the gate recess 207A), wherein the channel layer 208A is a doped layer formed within the semiconductor substrate 201. In the present embodiment, the forming of the channel regions 208A and 208B includes steps as follows: Firstly, as shown in FIG. 2C(1) which is a top view and FIG. 2C(2) which is a cross-sectional view taken along the cutting line C2C as depicted in FIG. 2C(1), a film (including poly-silicon plugs or oxide) is formed in the gate recesses 207A and 207B. For example, in the present embodiment, p-type doped poly-silicon plug 208P or oxide is formed to fill the gate recesses 207A and 207B, and a thermal annealing process is then performed to drive the p-type dopants (e.g., Boron) originally doped in the p-type doped poly-silicon plug 208P or oxide to out diffusion and penetrating through the bottom wall 207Ao and 207Bo as well as the sidewalls 207As and 207Bs of the gate recesses 207A and 207B, so as to form a doped channel regions 208A and 208B within the semiconductor substrate 201.

Referring to Step S223: forming a gate dielectric layer 209 in the gate recess 207A and 207B. FIG. 2D(1) is a top view illustrating a partial structure after the gate dielectric layer 209 is formed in the gate recesses 207A and 207B, and FIG. 2D(2) is a cross-sectional view taken along the cutting line C2D as depicted in FIG. 2D(1). In the present embodiment, the forming of the gate dielectric layer 209 includes steps as follows: Firstly, the p-type doped poly-silicon plug 208P filled in the gate recesses 207A and 207B is removed by an etching process; and then a thermal oxidation process is performed to growth thermal gate dielectric material on the bottom wall 207Ao and 207Bo as well as the sidewalls 207As and 207Bs of the gate recesses 207A and 207B. Thereby, the gate dielectric layer 209 made of the thermal gate dielectric material can protect the p-type doped silicon channel layer not to be exposed to outside environment or contamination issue.

Alternatively, in some other embodiments, the gate dielectric layer 209 can be a dielectric layer (e.g., including silicon dioxide or high-k dielectric material) formed on the bottom wall 207Ao and 207Bo as well as the sidewalls 207As and 207Bs of the gate recesses 207A and 207B by a deposition process (e.g., a low pressure chemical vapor deposition (LPCVD)).

Referring to Step S224: forming a gate region in the gate recess (such as 207A or 207B) and surrounded by the gate dielectric layer 209. FIG. 2E (1) is a top view illustrating a partial structure after the gate conductive regions 210A and 210B are respectively formed in the gate recesses 207A and 207B, and FIG. 2E(2) is a cross-sectional view taken along the cutting line C2E as depicted in FIG. 2E(1). In the present embodiment, the forming of the gate conductive regions 210A and 210B includes steps as follows: Firstly, a TiN film 211 is formed on the gate dielectric layer 209 in the gate recesses 207A and 207B by a deposition process (e.g., an atomic layer deposition (ALD) process) and the remaining parts of the gate recesses 207A and 207B are filled with tungsten 212. Subsequently, an etching back process is performed to remove the portions of the TiN film 211 and the tungsten 212 disposed in the gate recesses 207A and 207B, so as to make the top of the remaining TiN film 211 and the tungsten 212 below the original surface 201a of the semiconductor substrate 201.

Whereby, the remaining portions of the TiN film 211 and the tungsten 212 that are in the gate recesses 207A and 207B, below the original surface 201a of the semiconductor substrate 201, and surrounded by the gate dielectric layer 209, can be combined to serve as the gate conductive regions 210A and 210B respectively.

Referring to step S225: forming the gate cap region. Afterward, gate cap material 214 (such as, nitride) is filled into the gate recesses 207A and 207B respectively to protect the gate conductive regions 210A and 2106. In the present embodiment, the gate cap material 214 is formed by depositing nitride to fill the top portions of the gate recesses 207A and 207B, and planarizing (such as, using a CMP technology) the deposited gate cap 214 using the nitride hard mask layer 206 as a stop layer, wherein FIG. 2F(1) is a top view illustrating a partial structure after the dielectric material 214 is formed to fill the top portions of the gate recesses 207A and 2076; and FIG. 2F(2) is a cross-sectional view taken along the cutting line C2F as depicted in FIG. 2F(1).

Now referring to Step S23: forming conductive regions, wherein a bottom wall of the conductive region is aligned or substantially aligned with a top wall of the gate conductive region. The forming of the conductive regions includes sub-steps of S231-S233 described as follows:

Referring to Step S231: revealing the original surface of the substrate. Subsequently, the nitride hard mask layer 206, portions of the dielectric material 214 and the pad oxide layer 203 are etched or removed for revealing the STI 202 and the active area region (or the original surface of the substrate), and the remaining dielectric gate caps 214A and 214B are still on the top of gate conductive regions 210A and 210B to protect the gate conductive regions 210A and 210B from being exposed to the environment. Wherein FIG. 2G(1) is a top view illustrating a partial structure after the original surface of the substrate is revealed; and FIG. 2G(2) is a cross-sectional view taken along the cutting line C2G as depicted in FIG. 2G(1).

Referring to Step S232: etching the semiconductor substrate 201 to form recesses (including the first recess 216A) for the conductive regions, wherein FIG. 2H(1) is a top view illustrating a partial structure after a first recess 216A, a second recess 216B and a third recess 216C are formed in the semiconductor substrate 201; and FIG. 2H(2) is a cross-sectional view taken along the cutting line C2H as depicted in FIG. 2H(1).

In the present embodiment, an etching process using the combination of the STI, the gate dielectric layer 209 and the dielectric gate caps 214A and 214B as an etching mask is performed to remove the exposed portions of the semiconductor substrate 201 in the active area (including the top portions of the channel regions 208A and 208B) to form the first recess 216A, the second recess 216B and the third recess 216C. Wherein the first recess 216A and the second recess 216B are formed on two opposite sides of the dielectric gate cap 214A; the second recess 216B and the third recess 216C are formed on two opposite sides of the dielectric gate cap 214B.

Of note that the etching process for forming the first recess 216A, the second recess 216B and the third recess 216C should stop at a proper recess depth H2 to make the bottom surfaces 216Ao and 216Bo of the first recess 216A and the second recess 216B aligned or substantially aligned with the top wall 210At of the gate conductive region 210A, and to make the bottom surfaces 216Bo and 216Co of the second recess 216B and the third recess 216C aligned or substantially aligned with the top wall 210Bt of the gate conductive region 210B.

For example, the proper recess depth H2 can be well controlled through taking account of different etching rates selectivity for the semiconductor substrate 201 of silicon, the STI oxide 202 and the dielectric gate caps 214A and 214B of nitride. In some embodiments of the present disclosure, the proper recess depth H2 can be about 50 nm, and the bottom surface 216Ao, 216Bo and 216Co of the first recess 216A, the second recess 216B and the third recess 216C can be aligned to the bottom edges of the dielectric gate caps 214A and 214B. Moreover, as shown in FIG. 2H(2), the top surface of one terminal of the channel layer 208A or 208B is aligned or substantially aligned with the surface of the substrate (e.g., the surface 216Ao, 216Bo or 216Co).

Referring to Step S233: forming conductive regions by a selective growth method, wherein FIG. 2I(1) is a top view illustrating a partial structure after a first conductive region 213A, a second conductive region 213B and a third conductive region 213C are respectively formed in the first recess 216A, the second recess 216B and the third recess 216O; and FIG. 2I(2) is a cross-sectional view taken along the cutting line C2I as depicted in FIG. 2I(1).

The forming of the first conductive region 213A, the second conductive region 213B and the third conductive region 213C includes steps as follows: Firstly, a silicon selective growth process, such as a SEG process or an ALD process, is performed to form n-type lightly doped (n_LDD) regions 217A, 217B and 217C on the portions of the semiconductor 201 exposed from the first recess 216A, the second recess 216B and the third recess 216C respectively. Another silicon selective growth process (e.g., a SEG process or an ALD process) is then performed to form the heavy doped (N+) regions 218A, 218B and 218C on the n_LDD regions 217A, 217B and 217C respectively. Subsequently, an optional rapid thermal annealing (RTA) process is performed to enhance activation doping concentration of the n_LDD regions 217A, 217B and 217C and the heavy doped (N+) regions 218A, 218B and 218C. In one embodiment, each of the heavy doped (N+) regions 218A, 218B and 218C has a top surface aligned or substantially aligned with the top of the remaining STI oxide 202. As shown in FIG. 2I(2), the top wall of the first conductive region 213A is aligned or substantially aligned with a top wall of a shallow trench isolator (STI) region 202 next to the first conductive region 213A, but lower than a top wall of a gate cap layer 214A on the gate conductive region.

Due to the etching processes, in another embodiment, a distance of a vertical gap (when a bottom wall of the first conductive region 213A is higher than a top wall of the gate conductive region 210A) or a vertical overlap (when the bottom wall of the first conductive region 213A is lower than a top wall of the gate conductive region 210A) between the bottom wall of the first conductive region 213A and the top wall of the gate conductive region 210A is within a predetermined range, such as smaller than 3-5 nm.

Wherein the heavy doped (N+) regions 218A and the n_LDD regions 217A together form the first conductive region 213A; the heavy doped (N+) regions 218B and the n_LDD regions 217B together form the second conductive region 213B, and the heavy doped (N+) regions 218C and the n_LDD regions 217C together form the third conductive region 213C. By using the silicon selective growth technology to form the first conductive region 213A, the doping concentration profile from the bottom walls to the top wall of the first conductive region 213A can be adjustable. Similarly, the doping concentration profiles of the second conductive region 213B and the third conductive region 213C can be also adjustable.

The first conductive region 213A, the second conductive region 213B, the channel regions 208A, the gate conductive regions 210A and the gate dielectric layer 209 together can form the NMOS transistor 21. The third conductive region 213C, the second conductive region 213B, the channel regions 208B, the gate conductive regions 210B and the gate dielectric layer 209 together can form the NMOS transistor 22. The first conductive region 213A and the second conductive region 213B can respectively serve as the source and drain of the NMOS transistor 21. The third conductive region 213C and the second conductive region 213B can respectively serve as the source and drain of the NMOS transistor 22.

After a series steps of down-stream process are performed, the forming of the buried word line DRAM cell 20 can be implemented. Wherein the first conductive region 213A, the second conductive region 213B and the third conductive region 213C can be respectively connected to the storage node-1, the bit line BL and the storage node-2 of the buried word line DRAM cell 20 (as shown in FIG. 2I(2)).

In sum, because of taking into account the different etching selectivity for silicon, oxide and nitride (as shown in FIGS. 2H(1) and 2H(2)), it can provide better etching control of the silicon recess (such as, the first recess 216A, the second recess 216B and the third recess 216C) in which the source or drain of the NMOS transistors 21 and 22 is formed. Thus, the bottom level of the source/drain can be controlled to be aligned or substantially aligned with the bottom of the dielectric gate cap (or with the top walls of the gate conductive regions), and the GIDL current caused by the gate-source/drain overlapping can thus be reduced.

Moreover, since the N+ regions and the n_LDD regions of the new designed source or drain are formed by silicon selective epitaxy growth technology (as shown in FIGS. 2I(1) and 2I(2)), thus the lattice damages in the source or drain caused by the ion implantation process can be avoided. At the storage node side, compares to conventional design, new designed N+ regions of the present disclosure that are formed by silicon selective growth technology and have higher activation doping concentration and lower resistance. Therefore, this design of the present disclosure can improve turn on current of the NMOS transistors 21 and 22 than that of the conventional cell access transistor. For the channel of the NMOS transistors 21 and 22, it uses p-type doped poly-silicon plus thermal drive-in technology (as shown in FIGS. 2C(1) and 2C(2)). It can improve channel doping uniformity and reduces threshold voltage variation of the NMOS transistors 21 and 22.

In addition, the optimal RTA process form forming the first conductive region 213A, the second conductive region 213B and the third conductive region 213C can also perform a drive-in process to achieve the n_LDD regions 217A, 217B and 217C to gate overlap and reduces the source or drain resistance of the NMOS transistors 21 and 22.

To avoid the storage node (the first conductive region 213A or the third conductive region 213C) being short with the BL (the second conductive region 213B), in another embodiment shown in FIG. 2J(1) which is similar to FIG. 2H(2), the top surface of the remaining shallow trench isolator (STI) 202 could be a little bit lower than the top surface of the remaining dielectric gate caps 214A and 214B based on suitable etching solution. FIG. 2K(1) is the top view corresponding to FIG. 2J(1) when such process is applied to the DRAM array structure, in which a plurality of structures in FIG. 2J(1) are reproduced in the DRAM array.

Then as shown in FIG. 2J(2) which is similar to FIG. 2I(2), the first conductive region 213A, the second conductive region 213B and the third conductive region 213C are selectively grown in the first recess 216A, the second recess 216B and the third recess 216C based on the revealed Si in the active region. However, the top surfaces of the first conductive region 213A, the second conductive region 213B and the third conductive region 213C are lower than those of the remaining STI 202, the remaining dielectric gate caps 214A and 214B, such that the storage Node 1 or the storage Node 2 will not be short with BL. FIG. 2K(2) is the top view corresponding to FIG. 2J(2) when such process is applied to the DRAM array structure, in which a plurality of structures in FIG. 2J(2) are reproduced in the DRAM array. As shown in FIG. 2J(2), the top wall of the first conductive region 213A is lower than a top wall of a shallow trench isolator (STI) region 202 next to the first conductive region 213A, and lower than a top wall of a gate cap layer 214A on the gate conductive region as well.

Embodiment 2

According to one embodiment of the present disclosure, the method for forming a buried word line DRAM cell 30 having at least one access transistor (such as, NMOS transistors 31 and 32) includes steps as follows:

Step S31: preparing a semiconductor substrate with an original surface;

Step S32: forming a gate conductive region below the original surface of the semiconductor substrate, and the forming of the gate conductive region includes sub-steps S321-S325;

Step S321: using a patterned nitride hard mask layer to form a gate recess in the semiconductor substrate;

Step S322: forming a channel region in the gate recess, wherein the channel layer is independent from the semiconductor substrate (optionally);

Step S323: forming a gate dielectric layer in the gate recess;

Step S324: forming the gate conductive region in the gate recess and surrounded by the gate dielectric layer; and Step S325: forming the gate cap region; and Step S33: forming conductive regions, wherein a bottom wall of a first conductive region is aligned or substantially aligned with a top wall of the gate conductive region. The forming of the conductive regions includes sub-steps S331-S333:

Step S331: revealing the original surface of the substrate;

Step S332: etching the revealed semiconductor substrate to form a first recess for the first conductive region; and Step S333: forming the first conductive region by a selective growth method (e.g., a selective epitaxy growth (SEG) method or an atomic layer deposition (ALD) method).

Referring to Step S31: preparing a semiconductor substrate 301 with an original surface 301a. As show in FIG. 3A(1) which is a top view and FIG. 3A(2) which is a cross-sectional view taken along the cutting line C3A as depicted in FIG. 3A(1), the semiconductor substrate 301 includes a silicon layer, such as a poly-silicon layer or an amorphous silicon layer. Shallow trench isolator (STI) 302 is formed in the semiconductor substrate 301 to define an active area for forming the NMOS transistors; a pad oxide layer 303 is formed on the STI 302 and the original surface 301a of the semiconductor substrate 301, such that the active area surrounded by the STI 302. Then, use deep n_well implantation, p_well implantation, threshold implantation and thermal annealing process to form DRAM array cell well profile (including a p_well 304 in the semiconductor substrate 301). The pad oxide layer 303 may include silicon oxide, silicon oxy-nitride or the combination thereof.

Referring to Step S32: forming a gate conductive region 310A below the original surface 301a of the semiconductor substrate 301, the forming of the gate conductive region 310A includes sub-steps S321-S325 described as follows:

Referring to Step S321: patterning a nitride hard mask layer 306 and removing the unwanted material to form gate recesses (such as, the gate recesses 307A and 307B) in the semiconductor substrate 301, wherein FIG. 3B(1) is a top view illustrating a partial structure after the gate recesses 307A and 307B are formed in the semiconductor substrate 301. FIG. 3B(2) is a cross-sectional view taken along the cutting line C3B as depicted in FIG. 3B(1).

The forming of the gate recesses 307A and 307B includes steps as follows: Firstly, a patterned nitride hard mask layer 306 having at least one opening is formed on the pad oxide layer 303, and at least one etching process using the patterned nitride hard mask layer 306 as an etching mask is performed to remove portions of the pad oxide layer 303 and portions of the semiconductor substrate 301 to form the gate recesses 307A and 307B.

Alternatively, a signal photo-resist patterning (etching) process is performed to remove portions of the nitride hard mask layer 306, portions of the pad oxide layer 303 and portions of the semiconductor substrate 301, so as to define the gate recesses 307A and 307B within the active area.

Referring to Step S322: forming a channel region (such as the channel region 308A) in the gate recess (such as, the gate recess 307A), wherein the channel layer 308A is independent from the semiconductor substrate 301. FIG. 3C(1) is a top view illustrating a partial structure after the channel regions 308A and 308B are respectively formed in the gate recesses 307A and 307B. FIG. 3C(2) is a cross-sectional view taken along the cutting line C3C as depicted in FIG. 3C(1).

In the present embodiment, the forming of the channel regions 308A and 308B includes performing a process selective growth process (e.g., a SEG process or an ALD process) to respectively form a p-type doped layer, a silicon-germanium ($Si_{1-x}Ge_x$) layer on the bottom wall 307Ao and 307Bo as well as on the sidewalls 307As and 307Bs of the gate recesses 307A and 307B. Wherein each of the channel region 308A and 308B can be a deposited layer extending into the gate recess 307A or the gate recess 307B from the semiconductor substrate 301 independently. Moreover, such selective grown channel layer can improve channel doping uniformity, and the selective grown channel layer formed by selective epitaxy growth (SEG) p-type doped SixGe1-x or another high mobility materials can reduce channel resistance and improve turn on current. In another embodiment, the channel region could comprise a composite selectively grown layer which may include a high mobility sublayer (such as, SixGe1-x, silicon carbide ($Si_{1-x}C_x$), Gallium-arsenide ($Ga_{1-x}As_x$) or Indium-arsenide-Antimony ($In_{1-x}As_xSb$)) on the bottom wall 307Ao and 307Bo as well as on the sidewalls 307As and 307Bs of the gate recesses 307A and 307B, and a Si sublayer over the high mobility sublayer. The selectively grown Si sublayer is a cap layer between the high mobility sublayer and the gate oxide for interface traps reduction.

Referring to Step S323: forming a gate dielectric layer 309 in the gate recess 307A and 307B. FIG. 3D(1) is a top view illustrating a partial structure after the gate dielectric layer 309 is formed in the gate recesses 307A and 307B. FIG. 3D(2) is a cross-sectional view taken along the cutting line C3D as depicted in FIG. 3D(1). The forming of the gate dielectric layer 309 includes steps as follows: Firstly, a thermal oxidation process is performed to growth thermal gate dielectric material on the channel regions 308A and 308B in the gate recesses 307A and 307B. Thereby, the gate dielectric layer 309 made of the thermal gate dielectric material can protect the p-type doped layer or the $Si_{1-x}Ge_x$ layer not to be exposed to outside environment or contamination issue.

Alternatively, in some other embodiments, the gate dielectric layer 309 can be a dielectric layer (e.g., including silicon dioxide or high-k dielectric material) formed on the channel regions 308A and 308B by a deposition process (e.g., a low pressure chemical vapor deposition (LPCVD)).

Of note that, the gate dielectric layer 309 may include a horizontal extension portion 309a covering a top surface 308t of the channel regions 308A and 308B.

Referring to Step S324: forming a gate region in the gate recess 307A and surrounded by the gate dielectric layer 309. FIG. 3E (1) is a top view illustrating a partial structure after the gate conductive regions 310A and 3108 are respectively formed in the gate recesses 307A and 307B. FIG. 3E(2) is a cross-sectional view taken along the cutting line C3E as depicted in FIG. 3E(1). In the present embodiment, the forming of the gate conductive regions 310A and 3108 includes steps as follows: Firstly, a TiN film 311 is formed on the gate dielectric layer 309 in the gate recesses 307A and 307B by a deposition process (e.g., an atomic layer deposition (ALD) process) and the remaining parts of the gate recesses 307A and 307B are filled with tungsten 312. Subsequently, an etching back process is performed to remove the portions of the TiN film 311 and the tungsten 312 disposed in the gate recesses 307A and 307B, so as to make the top of the remaining TiN film 311 and the tungsten 312 below the original surface 301a of the semiconductor substrate 301.

Whereby, the remaining portions of the TiN film 311 and the tungsten 312 that are in the gate recesses 307A and 307B, below the original surface 301a of the semiconductor substrate 301, and surrounded by the gate dielectric layer 309, can be combined to serve as the gate conductive regions 310A and 310B respectively.

Referring to step S325: forming the gate cap region. Afterward, gate cap material 314 (such as, nitride) is filled into the gate recesses 307A and 307B respectively to protect the gate conductive regions 310A and 310B. In the present embodiment, the gate cap material 314 is formed by depositing nitride to fill the top portions of the gate recesses 307A and 307B, and planarizing (such as, using a CMP technology) the deposited gate cap material 314 using the nitride hard mask layer 306 as a stop layer, wherein FIG. 3F(1) is a top view illustrating a partial structure after the dielectric material 314 is formed to fill in the gate recesses 307A and 307B, and FIG. 3F(2) is a cross-sectional view taken along the cutting line C3F as depicted in FIG. 3F(1).

Now referring to Step S33: forming conductive regions, wherein a bottom wall of the conductive region is aligned or substantially aligned with a top wall of the gate conductive region. The forming of the conductive regions includes sub-steps of S331-S333 described as follows:

Referring to Step S331: revealing the original surface of the substrate. Subsequently, the nitride hard mask layer 306, portions of the dielectric material 314 and the pad oxide layer 303 are etched or removed for revealing the STI 302 and the active area region (or the original surface of the substrate), and the remaining dielectric gate caps 314A and 314B are still on the top of gate conductive regions 310A and 310B to protect the gate conductive regions 310A and 310B from being exposed to the environment. Wherein FIG. 3G(1) is a top view illustrating a partial structure after the original surface of the substrate is revealed; and FIG. 3G(2) is a cross-sectional view taken along the cutting line C3G as depicted in FIG. 3G(1).

Referring to Step S332: etching the semiconductor substrate 301 to form recesses (including the first recess 316A), wherein FIG. 3H(1) is a top view illustrating a partial structure after a first recess 316A, a second recess 316B and a third recess 316C are formed in the semiconductor substrate 301; and FIG. 3H(2) is a cross-sectional view taken along the cutting line C3H as depicted in FIG. 3H(1).

In the present embodiment, an etching process using the combination of the STI 302, the gate dielectric layer 309 and the dielectric gate caps 314A and 314B as an etching mask is performed to remove the exposed portions of the semiconductor substrate 301 in the active area (including the top portions of the channel regions 308A and 308B) to form the first recess 316A, the second recess 316B and the third recess 316C. Wherein the first recess 316A and the second recess 316B are formed on two opposite sides of the dielectric gate cap 314A; the second recess 316B and the third recess 316C are formed on two opposite sides of the dielectric gate cap 314B.

Of note that the etching process for forming the first recess 316A, the second recess 316B and the third recess 316C should stop at a proper recess depth H3 to make the bottoms 316Ao and 316Bo of the first recess 316A and the second recess 316B aligned or substantially aligned with the top wall 310At of the gate conductive region 310A, and to make the bottoms 316Bo and 316Co of the second recess 316B and the third recess 316C aligned or substantially aligned with the top wall 310Bt of the gate conductive region 310B.

For example, the proper recess depth H3 can be well controlled through taking account of different etching rates selectivity for the semiconductor substrate 301 of silicon, the STI oxide 303 and the dielectric gate caps 314A and 314B of nitride. In some embodiments of the present disclosure, the proper recess depth H3 can be about 50 nm, and the bottoms 316Ao, 316Bo and 316Co of the first recess 316A, the second recess 316B and the third recess 316C can be aligned to the bottom edges of the dielectric gate caps 314A and 314B. Moreover, as shown in FIG. 3H(2), the top surface of one terminal of the channel layer 308A or 308B is aligned or substantially aligned with the surface of the substrate (e.g., the surface 316Ao, 316Bo or 316Co).

Referring to Step S333: forming the first conductive region 313A by a selective growth method, wherein FIG. 3I(1) is a top view illustrating a partial structure after a first conductive region 313A, a second conductive region 313B and a third conductive region 313C are respectively formed in the first recess 316A, the second recess 316B and the third recess 316O; and FIG. 3I(2) is a cross-sectional view taken along the cutting line C3I as depicted in FIG. 3I(1).

The forming of the first conductive region 313A, the second conductive region 313B and the third conductive region 313C includes steps as follows: Firstly, a silicon selective growth process, such as a SEG process or an ALD process, is performed to form n-type lightly doped (n_LDD) regions 317A, 317B and 317C on the portions of the semiconductor 301 exposed from the first recess 316A, the second recess 316B and the third recess 316C. Another silicon selective growth process (e.g., a SEG process or an ALD process) is then performed to form the heavy doped (N+) regions 318A, 318B and 318C on the n_LDD regions 317A, 317B and 317C respectively.

Subsequently, an optional rapid thermal annealing (RTA) process is performed to enhance activation doping concentration of the n_LDD regions 317A, 317B and 317C and the heavy doped (N+) regions 318A, 318B and 318C. In one embodiment, each of the heavy doped (N+) regions 318A, 318B and 318C has a top surface aligned or substantially aligned with the top of the remaining STI oxide 302.

Wherein, the heavy doped (N+) regions 318A and the n_LDD regions 317A together form the first conductive region 313A; the heavy doped (N+) regions 318B and the n_LDD regions 317B together form the second conductive region 313B, and the heavy doped (N+) regions 318C and the n_LDD regions 317C together form the third conductive region 313C. By using the silicon selective growth technology to form the first conductive region 313A, the doping concentration profile from the bottom walls to the top wall of the first conductive region 313A can be adjustable. Similarly, the doping concentration profiles of the second conductive region 313B and the third conductive region 313C can be also adjustable.

The first conductive region 313A, the second conductive region 313B, the channel regions 308A, the gate conductive regions 310A and the gate dielectric layer 309 together can form the NMOS transistor 31. The third conductive region 313C, the second conductive region 313B, the channel regions 308, the gate conductive regions 310B and the gate dielectric layer 309 together can form the NMOS transistor 32. The first conductive region 313A and the second conductive region 313B can respectively serve as the source and drain of the NMOS transistor 31. The third conductive region 313C and the second conductive region 313B can respectively serve as the source and drain of the NMOS transistor 32.

After a series steps of down-stream process are performed, the forming of the buried word line DRAM cell 30 can be implemented. Wherein the first conductive region 313A, the second conductive region 313B and the third conductive region 313C can be respectively connected to the storage node-1, the bit line BL and the storage node-2 of the buried word line DRAM cell 30 (as shown in FIG. 3I(2)).

As previously mentioned, because of taking into account the different etching selectivity for silicon, oxide and nitride (as shown in FIGS. 3H(1) and 3H(2)), it can provide better etching control of the silicon recess (such as, the first recess 316A, the second recess 316B and the third recess 316C) in which the source or drain of the NMOS transistors 31 and 32 is formed. Thus, the bottom level of the source/drain can be controlled to be aligned or substantially aligned with the bottom of the dielectric gate cap (or with the top walls of the gate conductive regions), and the GIDL current caused by the gate-source/drain overlapping can thus be reduced.

Moreover, since the N+ regions and the n_LDD regions of the new designed source or drain are formed by silicon selective epitaxy growth technology (as shown in FIGS. 3I(1) and 3I(2)), thus the lattice damages in the source or drain caused by the ion implantation process can be avoided. At the storage node side, compares to conventional design, new designed N+ regions of the present disclosure that are formed by silicon selective growth technology and have higher activation doping concentration and lower resistance. Therefore, this design of the present disclosure can improve turn on current of the NMOS transistors 31 and 32 than that of the conventional cell access transistor. For the channel of the NMOS transistors 31 and 32, it uses SEG doped p-type poly-silicon (as shown in FIGS. 3C(1) and 3C(2)) to improve channel doping uniformity and reduces threshold voltage variation of the NMOS transistors 31 and 32.

Furthermore, as shown in FIG. 3I(2), the gate dielectric layer 309 (thermal oxide) includes a horizontal extension portion 309a covering a top surface of the drain/source regions, such that the drain/source regions are separate from the nitride dielectric gate caps 314A and 314B to further reduce GIDL issue.

In addition, the optimal RTA process form forming the first conductive region 313A, the second conductive region 313B and the third conductive region 313C can also perform a drive-in process to achieve the n_LDD regions 317A, 317B and 317C to gate overlap and reduces the source or drain resistance of the NMOS transistors 31 and 32.

Embodiment 3

According to one embodiment of the present disclosure, the method for forming a buried word line DRAM cell 40 having at least one access transistor (such as, vertical NMOS transistors 41 and 42) includes steps as follows:

Step S41: preparing a semiconductor substrate with an original surface;

Step S42: forming a gate conductive region below the original surface of the semiconductor substrate; and the forming of the gate conductive region includes sub-steps S421-S424;

Step S421: using a hard mask oxide layer to form a gate recess in the semiconductor substrate;

Step S422: forming a channel region in the gate recess, wherein the channel layer is independent from the semiconductor substrate (optionally);

Step S423: forming a gate dielectric layer in the gate recess; and

Step S424: forming the gate conductive region in the gate recess and surrounded by the gate dielectric layer; and Step S43: forming a first conductive region, wherein a bottom wall of the first conductive region is aligned or substantially aligned with a top wall of the gate conductive region, and the forming of the first conductive region includes sub-steps S431-S433 described as follows:

Step S431: removing the hard mask oxide layer;

Step S432: etching the semiconductor substrate to form a first recess; and

Step S433: forming the first conductive region by a selective growth method (e.g., a SEG method or an ALD method).

Referring to Step S41: preparing a semiconductor substrate with an original surface. FIG. 4A(1) is a top view illustrating a partial structure of the semiconductor substrate 401 used for forming vertical NMOS transistors 41 and 42 of a buried word line DRAM cell 40, according to one embodiment of the present disclosure. FIG. 4A(2) is a cross-sectional view taken along the cutting line C4A as depicted in FIG. 4A(1).

In the present embodiment, the semiconductor substrate 401 includes a silicon layer, such as a poly-silicon layer or an amorphous silicon layer. As shown in FIGS. 4A(1) and 4A(2), at least one shallow trench isolator (STI) 402 is then formed in the semiconductor substrate 401 to define an active area for forming the vertical NMOS transistors 431 and 42; a pad oxide layer 403 is formed on the STI 402 and the original surface 401a of the semiconductor substrate 301; the active area surrounded by the STI 402 is dopped with n-type dopants by a Deep n_well implantation process; and a Deep p_well implant process 405 is performed on the active area to form a p_well 404 in the semiconductor substrate 401. The pad oxide layer 303 may include silicon oxide, silicon oxy-nitride or the combination thereof.

Referring to Step S42: forming a gate conductive region below the original surface of the semiconductor substrate, wherein the forming of the gate conductive region includes sub-steps S421-S424 described as follows:

Referring to Step S421: using a hard mask oxide layer to form a gate recess in the semiconductor substrate, FIG. 4B(1) is a top view illustrating a partial structure after the gate recesses 407A and 407B are formed in the semiconductor substrate 401. FIG. 4B(2) is a cross-sectional view taken along the cutting line C4B as depicted in FIG. 4B(1).

In some embodiments of the present disclosure, the forming of the gate recesses 407A and 407B includes steps as follows: Firstly, a hard mask oxide layer 406 is formed on the pad oxide layer 403, and at least one photo-resist patterning (etching) process is performed to remove portions of the hard mask oxide layer 406, portions of the pad oxide layer 403 and portions of the semiconductor substrate 401, so as to define the gate recesses 407A and 407B within the active area. In the present embodiment, the hard mask oxide layer 406 is a silicon dioxide (SiO$_2$) layer formed by a deposition process (e.g., a LPCVD process).

Referring to Step S422: forming a channel region in the gate recess, wherein the channel layer is independent from the semiconductor substrate. FIG. 4C(1) is a top view illustrating a partial structure after the channel regions 408A and 408B are respectively formed in the gate recesses 407A and 407B. FIG. 4C(2) is a cross-sectional view taken along the cutting line C4C as depicted in FIG. 4C(1).

In the present embodiment, the forming of the channel regions 408A and 408B includes performing a process selective growth process (e.g., a SEG process or an ALD process) to respectively form a p-type doped poly-silicon layer or a silicon-germanium (Si$_{1-x}$Ge$_x$) layer on the bottom wall 407Ao and 407Bo as well as on the sidewalls 407As and 407Bs of the gate recesses 407A and 407B. Wherein each of the channel region 408A and 408B can be a deposited layer extending into the gate recess 407A or the gate recess 407B from the semiconductor substrate 401 independently.

Referring to Step S423: forming a gate dielectric layer in the gate recess. FIG. 4D(1) is a top view illustrating a partial structure after the gate dielectric layer 309 is formed in the gate recesses 407A and 407B. FIG. 4D(2) is a cross-sectional view taken along the cutting line C4D as depicted in FIG. 4D(1).

In the present embodiment, the forming of the gate dielectric layer 409 includes steps as follows: Firstly, a thermal oxidation process is performed to growth thermal gate dielectric material on the channel regions 408A and 408B in the gate recesses 407A and 407B. Thereby, the gate dielectric layer 409 made of the thermal gate dielectric material can protect the p-type doped silicon layer or the layer not to be exposed to outside environment or contamination issue.

Alternatively, in some other embodiments, the gate dielectric layer 409 can be a dielectric layer (e.g., including silicon dioxide or high-k dielectric material) formed on the channel regions 408A and 408B by a deposition process (e.g., a LPCVD process).

Of note that, the gate dielectric layer 409 may include a horizontal extension portion 309a covering a top surface 408t of the channel regions 408A and 408B.

Referring to Step S424: forming a gate conductive region n the gate recess and surrounded by the gate dielectric layer. FIG. 4E (1) is a top view illustrating a partial structure after the gate conductive regions 410A and 4108 are respectively formed in the gate recesses 407A and 407B. FIG. 4E(2) is a cross-sectional view taken along the cutting line C4E as depicted in FIG. 4E(1).

In the present embodiment, the forming of the gate conductive regions 410A and 410B includes steps as follows: Firstly, a TiN film 411 is formed on the gate dielectric layer 409 in the gate recesses 407A and 407B by a deposition process (e.g., an ALD process) and the remaining parts of the gate recesses 407A and 407B are filled with tungsten 412. Then, a planarization process (such as, a CMP process) using the hard mask oxide layer 406 a stop layer is performed to remove portions of the TiN film 411 and the tungsten 412 disposed on the hard mask oxide layer 406. Subsequently, an etching back process is performed to remove the portions of the TiN film 411 and the tungsten 412 disposed on the top of the gate recesses 407A and 407B, so as to make the top surface of the remaining TiN film 411 and the tungsten 412 below the original surface 401a of the semiconductor substrate 401.

Whereby, the remaining portions of the TiN film 411 and the tungsten 412 that are disposed in the gate recesses 407A and 407B, below the original surface 401a of the semiconductor substrate 401, and surrounded by the gate dielectric layer 409, can be combined to serve as the gate conductive regions 410A and 410B respectively.

Referring to Step S43: forming a first conductive region 413A, wherein a bottom wall 413Ao of the first conductive region 413A is aligned or substantially aligned with a top wall 410At of the gate conductive region 410A, the forming of the first conductive region 413A includes sub-steps of S431-S434 described as follows:

Referring to Step S431: removing the hard mask oxide layer 406. Prior to removing the hard mask oxide layer 406, two dielectric gate caps 414A and 414B may be formed to fill the top portions of the gate recesses 407A and 407B respectively to protect the gate conductive regions 410A and 410B. In the present embodiment, the dielectric gate caps 414A and 414B are formed by depositing a gate cap dielectric material (such as, nitride) to fill the top portions of the gate recesses 407A and 407B, and planarizing (such as, using a CMP technology) the deposited dielectric material using the hard mask oxide layer 406 as a stop layer. FIG. 4F(1) is a top view illustrating a partial structure after the dielectric gate caps 414A and 414B are formed to fill in the gate recesses 407A and 407B, and FIG. 4F(2) is a cross-sectional view taken along the cutting line C4F as depicted in FIG. 4F(1).

Subsequently, at least one photo-resist etching process is used to remove the hard mask oxide layer 406 and the pad oxide layer 403 for exposing the STI 402 and the active area region. FIG. 4G(1) is a top view illustrating a partial structure after the hard mask oxide layer 406 is removed; and FIG. 4G(2) is a cross-sectional view taken along the cutting line C4F as depicted in FIG. 4F(1). Wherein, the dielectric gate caps 414A and 414B are remained to protect the gate conductive regions 410A and 410B from being exposed to the environment. Each of the dielectric gate caps 414A and 414B has a horizontal extension portion 414*e* covering the horizontal extension portion 409*a* of the gate dielectric layer 409.

Referring to Step S432: etching the semiconductor substrate 401 to form a first recess 416A, FIG. 4H(1) is a top view illustrating a partial structure after a first recess 416A, a second recess 416B and a third recess 416C are formed in the semiconductor substrate 401; and FIG. 4H(2) is a cross-sectional view taken along the cutting line C4H as depicted in FIG. 4H(1).

In the present embodiment, an etching process using the combination of the STI 402, the gate dielectric layer 409 and the dielectric gate caps 414A and 414B as an etching mask is performed to remove the exposed portions of the semiconductor substrate 401 in the active area (including the top portions of the channel regions 408A and 408B) to form the first recess 416A, the second recess 416B and the third recess 416C. Wherein the first recess 416A and the second recess 416B are formed on two opposite sides of the dielectric gate cap 414A; the second recess 416B and the third recess 416C are formed on two opposite sides of the dielectric gate cap 414B.

Of note that the etching process for forming the first recess 416A, the second recess 416B and the third recess 416C should stop at a proper recess depth H4 to make the bottoms 416Ao and 416Bo of the first recess 416A and the second recess 416B aligned or substantially aligned with the top wall 410At of the gate conductive region 410A, and to make the bottoms 416Bo and 416Co of the second recess 416B and the third recess 416C aligned or substantially aligned with the top wall 410Bt of the gate conductive region 410B.

For example, the proper recess depth H4 can be well controlled through taking account of different etching rates selectivity for the semiconductor substrate 401 of silicon, the STI 403 of oxide and the dielectric gate caps 414A and 414B of nitride. In some embodiments of the present disclosure, the proper recess depth H4 can be about 50 nm, and the bottoms 416Ao, 416Bo and 416Co of the first recess 416A, the second recess 416B and the third recess 416C can be aligned to the bottom edges 414*g* of the dielectric gate caps 414A and 414B.

Referring to Step S433: forming the first conductive region 413A by a selective growth method, FIG. 4I(1) is a top view illustrating a partial structure after a first conductive region 413A, a second conductive region 413B and a third conductive region 413C are respectively formed in the first recess 416A, the second recess 416B and the third recess 4160; and FIG. 4I(2) is a cross-sectional view taken along the cutting line C4I as depicted in FIG. 4I(1).

The forming of the first conductive region 413A, the second conductive region 413B and the third conductive region 413C includes steps as follows: Firstly, a silicon selective growth process, such as a SEG process or an ALD process, is performed to form n-type lightly doped (n_LDD) regions 417A, 417B and 417C on the portions of the semiconductor 401 exposed from the first recess 416A, the second recess 416B and the third recess 416C. Another silicon selective growth process (e.g., a SEG process or an ALD process) is then performed to form the heavy doped (N+) regions 418A, 418B and 418C on the n_LDD regions 417A, 417B and 417C respectively. Subsequently, an optional rapid thermal annealing (RTA) process is performed to enhance activation doping concentration of the n_LDD regions 417A, 417B and 417C and the heavy doped (N+) regions 418A, 418B and 418C.

Wherein, the heavy doped (N+) regions 418A and the n_LDD regions 417A together form the first conductive region 413A; the heavy doped (N+) regions 418B and the n_LDD regions 417B together form the second conductive region 413B, and the heavy doped (N+) regions 418C and the n_LDD regions 417C together form the third conductive region 413C. By using the silicon selective growth technology to form the first conductive region 413A, the he doping concentration profile from the bottom walls 413Ao to the top wall 413At of the first conductive region 413A can be adjustable. Similarly, the doping concentration profiles of the second conductive region 413B and the third conductive region 413C can be also adjustable.

The first conductive region 413A, the second conductive region 413B, the channel regions 408A, the gate conductive regions 410A and the gate dielectric layer 409 together can form the vertical NMOS transistor 41. The third conductive region 413C, the second conductive region 413B, the channel regions 408B, the gate conductive regions 410B and the gate dielectric layer 409 together can form the vertical NMOS transistor 42. The first conductive region 413A and the second conductive region 413B can respectively serve as the source and drain of the vertical NMOS transistor 41. The third conductive region 413C and the second conductive region 413B can respectively serve as the source and drain of the vertical NMOS transistor 42.

After a series steps of down-stream process are performed, the forming of the buried word line DRAM cell 40 can be implemented. Wherein the first conductive region 413A, the second conductive region 413B and the third conductive region 413C can be respectively connected to the storage node-1, the bit line BL and the storage node-2 of the buried word line DRAM cell 40 (as shown in FIG. 4I(2)).

In sum, during the forming of the buried word line DRAM cell 40, because of taking into account the different etching selectivity for silicon, oxide and nitride (as shown in FIGS. 4H(1) and 4H(2)), and using the hard mask oxide layer 406 to enhance etching selectivity to nitride and silicon (as shown in FIGS. 4G(1) and 4G(2)), it can provide better etching control of the silicon recess (such as, the first recess 416A, the second recess 416B and the third recess 416C) in which the source or drain of the vertical NMOS transistors 41 and 42 is formed. Such that, the bottom level of the source/drain can be controlled to be aligned or substantially aligned with the bottom of the dielectric gate cap (or with the top walls of the gate conductive regions), and the GIDL current caused by the gate-source/drain overlapping can thus be reduced.

Moreover, since the N+ regions and the n_LDD regions of the new designed source or drain are formed by silicon selective epitaxy growth technology (as shown in FIGS. 4I(1) and 4I(2)), thus the lattice damages in the source or drain caused by the ion implantation process can be avoided. At the storage node side, compares to conventional design, new designed N+ regions of the present disclosure that are formed by silicon selective growth technology and have higher activation doping concentration and lower resistance. Therefore, this design of the present disclosure can improve turn on current of the vertical NMOS transistors 41 and 42 than that of the conventional cell access transistor. For the channel of the vertical NMOS transistors 41 and 42, it uses p-type doped poly-silicon plus thermal drive-in technology (as shown in FIGS. 4C(1) and 4C(2)). It can improve channel doping uniformity and reduces threshold voltage variation of the vertical NMOS transistors 41 and 42.

In addition, the optimal RTA process form forming the first conductive region 413A, the second conductive region 413B and the third conductive region 413C can also perform a drive-in process to achieve the n_LDD regions 417A, 417B and 417C to gate overlap and reduces the source or drain resistance of the vertical NMOS transistors 41 and 42.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a transistor structure comprising:
preparing a substrate with an original surface;
using a hard mask layer to form a gate recess;
forming of a channel region comprising:
depositing a doped semiconductor layer in the gate recess;
thermal annealing the doped semiconductor layer to form the channel region underneath the gate recess; and
forming a gate dielectric layer in the gate recess;
forming a gate conductive region in the gate recess, wherein at least a portion of the gate conductive region is disposed below the original surface; and a bottom wall and sidewalls of the gate conductive region are surrounded by the gate dielectric layer; and
forming a first conductive region after the forming of the gate conductive region, wherein a bottom wall of the first conductive region is aligned with a top wall of the gate conductive region.

2. The method according to claim 1, wherein the hard mask layer is a nitride hard mask layer.

3. The method according to claim 2, wherein the forming of the first conductive region comprises:
removing the nitride hard mask layer;
etching the substrate to form a first recess; and
forming the first conductive region by a selective growth process.

4. The method according to claim 3, wherein the selective growth process comprises a selective epitaxy growth (SEG) method or an atomic layer deposition (ALD) method.

5. A method for forming a transistor structure comprising:
preparing a substrate with an original surface;
using a nitride hard mask layer to form a gate recess for the gate conductive region;
forming of a channel region comprising:
depositing a p-type doped poly-silicon plug or oxide in the gate recess; and
thermal annealing the p-type doped poly-silicon plug or oxide to form the channel region underneath the gate recess;

forming a gate dielectric layer in the gate recess;
forming a gate conductive region in the gate recess, wherein at least a portion of the gate conductive region is disposed below the original surface; and a bottom wall and sidewalls of the gate conductive region are surrounded by the gate dielectric layer; and
forming a first conductive region after the forming of the gate conductive region, wherein a bottom wall of the first conductive region is aligned or substantially aligned with a top wall of the gate conductive region.

6. A method for forming a transistor structure comprising:
preparing a substrate with an original surface;
forming a gate conductive region, wherein at least a portion of the gate conductive region is disposed below the original surface; and a bottom wall and sidewalls of the gate conductive region are surrounded by a gate dielectric layer, wherein the forming of the gate conductive region comprises:
using a first hard mask layer to form a gate recess for the gate conductive region;
forming a channel region comprising:
depositing a doped semiconductor layer in the gate recess; and
thermal annealing the doped semiconductor layer to form the channel region underneath the gate recess;
forming the gate dielectric layer in the gate recess; and
forming the gate conductive region in the gate recess;
depositing a second hard mask layer over the gate conductive region;
removing the first hard mask to reveal portion of the original surface of the substrate and etching down the revealed original surface to form a first recess; and
forming a first conductive region by a selective growth process based on the first recess, wherein a bottom wall of the first conductive region is aligned with a top wall of the gate conductive region.

7. The method according to claim 6, wherein the second hard mask layer comprises an edge portion outside a peripheral of the gate conductive region, and the first conductive region is limited by and not higher than the edge portion.

8. The method according to claim 7, wherein the selective growth process comprises a SEG method or an ALD method.

9. A method for forming a transistor structure comprising:
preparing a substrate with an original surface;
using a hard mask oxide layer to form a gate recess for the gate conductive region;
depositing a p-type doped poly-silicon plug or oxide in the gate recess;
thermal annealing the p-type doped poly-silicon plug or oxide to form the channel region underneath the gate recess;
forming a gate dielectric layer in the gate recess;
forming a gate conductive region in the gate recess, wherein at least a portion of the gate conductive region is disposed below the original surface; and a bottom wall and sidewalls of the gate conductive region are surrounded by the gate dielectric layer; and
forming a first conductive region after the forming of the gate conductive region, wherein a bottom wall of the first conductive region is aligned or substantially aligned with a top wall of the gate conductive region.

* * * * *